United States Patent
Matsuzawa et al.

(10) Patent No.: US 8,379,350 B2
(45) Date of Patent: Feb. 19, 2013

(54) CPP-TYPE MAGNETORESISTIVE ELEMENT INCLUDING SPACER LAYER

(75) Inventors: Hironobu Matsuzawa, Tokyo (JP); Yoshihiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 401 days.

(21) Appl. No.: 12/827,363

(22) Filed: Jun. 30, 2010

(65) Prior Publication Data
US 2012/0002330 A1    Jan. 5, 2012

(51) Int. Cl.
*G11B 5/33*  (2006.01)
(52) U.S. Cl. ............................................... 360/324
(58) Field of Classification Search ............... None
See application file for complete search history.

(56) References Cited

U.S. PATENT DOCUMENTS

| | | | |
|---|---|---|---|
| 7,072,153 B2 | 7/2006 | Koui et al. | |
| 7,218,483 B2 | 5/2007 | Yuasa et al. | |
| 2008/0062557 A1 | 3/2008 | Tsuchiya et al. | |
| 2009/0002893 A1 | 1/2009 | Tsuchiya et al. | |
| 2009/0059443 A1* | 3/2009 | Tsuchiya et al. | 360/324.2 |
| 2009/0086383 A1* | 4/2009 | Hara et al. | 360/324 |
| 2010/0214701 A1* | 8/2010 | Tsuchiya et al. | 360/324.12 |

OTHER PUBLICATIONS

U.S. Appl. No. 12/382,137, filed Mar. 10, 2009 in the name of Hara et al.

* cited by examiner

*Primary Examiner* — David D Davis
(74) *Attorney, Agent, or Firm* — Oliff & Berridge, PLC

(57) ABSTRACT

An MR element includes a first ferromagnetic layer, a second ferromagnetic layer, and a spacer layer disposed between the first and second ferromagnetic layers. The spacer layer includes a nonmagnetic metal layer, a first oxide semiconductor layer, and a second oxide semiconductor layer that are stacked in this order. The nonmagnetic metal layer is made of Cu, and has a thickness in the range of 0.3 to 1.5 nm. The first oxide semiconductor layer is made of a Ga oxide semiconductor, and has a thickness in the range of 0.5 to 2.0 nm. The second oxide semiconductor layer is made of a Zn oxide semiconductor, and has a thickness in the range of 0.1 to 1.0 nm.

8 Claims, 10 Drawing Sheets

CPP-TYPE MAGNETORESISTIVE ELEMENT INCLUDING SPACER LAYER

BACKGROUND OF THE INVENTION

1. Field of the Invention

The present invention relates to a magnetoresistive element for use in magnetic recording devices, oscillators, magnetoresistive random access memories (MRAMs), magnetic sensors and the like, and to a thin-film magnetic head, a head assembly, and a magnetic recording device that each include the magnetoresistive element.

2. Description of the Related Art

Recently, magnetic recording devices such as magnetic disk drives have been improved in areal recording density, and thin-film magnetic heads of improved performance have been demanded accordingly. Among the thin-film magnetic heads, a composite thin-film magnetic head has been used widely. The composite thin-film magnetic head has such a structure that a read head including a magnetoresistive element (hereinafter, also referred to as MR element) for reading and a write head including an induction-type electromagnetic transducer for writing are stacked on a substrate.

Examples of MR elements include a giant magnetoresistive (GMR) element utilizing a giant magnetoresistive effect and a tunneling magnetoresistive (TMR) element utilizing a tunneling magnetoresistive effect.

Read heads are required to have characteristics of high sensitivity and high output. As the read heads that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer opposite from the spacer layer. The free layer is a ferromagnetic layer whose direction of magnetization changes in response to a signal magnetic field. The pinned layer is a ferromagnetic layer whose direction of magnetization is pinned. The antiferromagnetic layer is a layer that pins the direction of magnetization of the pinned layer by means of exchange coupling with the pinned layer. For spin-valve GMR elements, the spacer layer is a nonmagnetic conductive layer. For TMR elements, the spacer layer is a tunnel barrier layer. The tunnel barrier layer is typically an insulating layer made of an insulating material such as aluminum oxide or magnesium oxide.

Examples of the GMR elements include one having a current-in-plane (CIP) structure in which a current for magnetic signal detection (hereinafter referred to as sense current) is fed in the direction parallel to the planes of the layers constituting the GMR element, and one having a current-perpendicular-to-plane (CPP) structure in which the sense current is fed in a direction intersecting the planes of the layers constituting the GMR element, such as the direction perpendicular to the planes of the layers constituting the GMR element. Hereinafter, a GMR element that has the CPP structure will be referred to as a CPP-GMR element, and a GMR element that has the CIP structure will be referred to as a CIP-GMR element. TMR elements also have the CPP structure.

In recent years, with an increase in recording density, there have been increasing demands for a reduction in track width of the read head. A reduction in track width of the read head is achievable by reducing the width of the MR element. As the width of the MR element is reduced, the length of the MR element in a direction perpendicular to the medium facing surface, which is the surface of the thin-film magnetic head to face the recording medium, is also reduced. As a result, the top and bottom surfaces of the MR element are reduced in area.

The read head using a CIP-GMR element includes shield gap films for separating the CIP-GMR element from respective shield layers that are disposed over and below the CIP-GMR element. The heat dissipation efficiency therefore drops if the top and bottom surfaces of the CIP-GMR element are reduced in area. Such a read head has the problem that the operating current is limited in order to ensure reliability.

In contrast, the read head using a CPP-GMR element needs no shield gap film, and the top and bottom surfaces of the CPP-GMR element are in contact with respective electrode layers. The electrode layers may also serve as shield layers. Such a read head has a high heat dissipation efficiency since the top and bottom surfaces of the CPP-GMR element are in contact with the respective electrode layers. This makes it possible to increase the operating current of the read head. In such a read head, the smaller the areas of the top and bottom surfaces of the CPP-GMR element, the higher the resistance of the element and the greater the magnetoresistance change amount of the element. The CPP-GMR element is thus suited to reduce the track width.

A typical CPP-GMR element, however, shows a small magnetoresistance change amount because the spacer layer, i.e., a nonmagnetic conductive layer, has low resistance. Accordingly, there is a problem that it is not possible to obtain a sufficiently high value for the magnetoresistance change ratio, i.e., the ratio of the magnetoresistance change to the resistance of the element (hereinafter referred to as MR change ratio).

On the other hand, TMR elements have the following problem. TMR elements have high resistance since their spacer layer has high resistance contrary to the foregoing typical CPP-GMR element. There is a need for magnetic disk drives that have an improved data transfer rate as well as improved recording density. Favorable high-frequency response is thus required of the read head. The high resistance of the TMR element, however, increases the stray capacitance occurring in the TMR element and in the circuits connected thereto, which degrades the high-frequency response of the read head.

Under the circumstances, various proposals have been made, as described below, for making the resistance of the spacer layer of the CPP-GMR element and the resistance of the element appropriate in value.

U.S. Pat. No. 7,072,153 describes a CPP-GMR element of current confined type. The CPP-GMR element includes: a magnetization pinned layer whose direction of magnetization is pinned; a magnetization free layer whose direction of magnetization changes in response to an external magnetic field; and an intermediate layer that is provided between the magnetization pinned layer and the magnetization free layer. The intermediate layer includes a first layer (oxide intermediate layer) that is made of an oxide having a region of relatively high resistance and a region of relatively low resistance. The sense current flows preferentially through the region of relatively low resistance when passing the first layer.

U.S. Pat. No. 7,218,483 describes a CPP-GMR element as follows. The CPP-GMR element includes: a magnetization pinned layer whose direction of magnetization is pinned; a magnetization free layer whose direction of magnetization changes in response to an external magnetic field; a nonmagnetic metal intermediate layer that is provided between the magnetization pinned layer and the magnetization free layer; and a resistance adjustment layer that is provided between the magnetization pinned layer and the magnetization free layer and is made of a material containing conduction carriers no more than $10^{22}/cm^3$. The document describes that a semiconductor or a semimetal is desirable as the material of the resistance adjustment layer, and lists ZnO as an example of the semiconductor.

U.S. Patent Application Publication No. 2008/0062557 A1 and U.S. Patent Application Publication No. 2009/0002893 A1 each describe a CPP-GMR element whose spacer layer includes a layer formed of an oxide semiconductor such as ZnO.

U.S. Patent Application Publication No. 2009/0086383 A1 describes a CPP-GMR element whose spacer layer includes a layer formed of an oxide of Zn, Ga, or the like.

For the CPP-GMR elements, providing a spacer layer that includes a layer formed of an oxide semiconductor is considered to be useful in making the resistances of the spacer layer and the element appropriate in value. The inventors of this application actually fabricated CPP-GMR elements having a spacer layer including a layer formed of an oxide semiconductor by using various types of oxide semiconductors, and examined the elements for characteristics. The results revealed that it is difficult to make the element resistance appropriate in value and make the MR change ratio sufficiently high if the spacer layer includes only a layer of a single type of oxide semiconductor as the layer formed of an oxide semiconductor.

OBJECT AND SUMMARY OF THE INVENTION

It is an object of the present invention to provide a magnetoresistive element that can provide a resistance of an appropriate value and a sufficiently high MR change ratio, and to a thin-film magnetic head, a head assembly, and a magnetic recording device that each include such a magnetoresistive element.

A magnetoresistive element of the present invention includes a first ferromagnetic layer, a second ferromagnetic layer, and a spacer layer that is disposed between the first and second ferromagnetic layers. A current for magnetic signal detection is fed to the magnetoresistive element in a direction intersecting the plane of each of the layers. In the magnetoresistive element of the present invention, the spacer layer includes a nonmagnetic metal layer, a first oxide semiconductor layer, and a second oxide semiconductor layer that are stacked in this order. The nonmagnetic metal layer is made of Cu, and has a thickness in the range of 0.3 to 1.5 nm. The first oxide semiconductor layer is made of a Ga oxide semiconductor, and has a thickness in the range of 0.5 to 2.0 nm. The second oxide semiconductor layer is made of a Zn oxide semiconductor, and has a thickness in the range of 0.1 to 1.0 nm.

In the magnetoresistive element of the present invention, the Ga oxide semiconductor may be $Ga_2O_3$, and the Zn oxide semiconductor may be ZnO. The second oxide semiconductor layer may have a thickness in the range of 0.5 to 1.0 nm.

In the magnetoresistive element of the present invention, the first ferromagnetic layer may be a free layer whose direction of magnetization changes in response to an external magnetic field, and the second ferromagnetic layer may be a pinned layer whose direction of magnetization is pinned. Alternatively, each of the first and second ferromagnetic layers may be a free layer whose direction of magnetization changes in response to an external magnetic field. A relative angle between the direction of magnetization of the first ferromagnetic layer and the direction of magnetization of the second ferromagnetic layer may change in response to the external magnetic field.

A thin-film magnetic head of the present invention includes a medium facing surface that faces a recording medium, and the magnetoresistive element of the present invention disposed near the medium facing surface.

A head assembly of the present invention includes a slider, and a supporter that flexibly supports the slider. The slider includes the thin-film magnetic head of the present invention and is disposed to face the recording medium.

A magnetic recording device of the present invention includes a recording medium, the thin-film magnetic head of the present invention, and a positioning device that supports the thin-film magnetic head and positions the thin-film magnetic head with respect to the recording medium.

In the magnetoresistive element of the present invention, and the thin-film magnetic head and the magnetic recording device each including the magnetoresistive element, the spacer layer of the magnetoresistive element includes the nonmagnetic metal layer made of Cu, the first oxide semiconductor layer made of a Ga oxide semiconductor, and the second oxide semiconductor layer made of a Zn oxide semiconductor. The nonmagnetic metal layer and the first and second oxide semiconductor layers have thicknesses in respective predetermined ranges. Consequently, according to the present invention, it is possible to make the resistance of the magnetoresistive element appropriate in value and make the MR change ratio sufficiently high. The nonmagnetic metal layer has the function of preventing oxidation of one of the ferromagnetic layers that is in contact with the spacer layer, thereby preventing the characteristic degradation of the one of the ferromagnetic layers.

Other and further objects, features and advantages of the present invention will appear more fully from the following description.

DETAILED DESCRIPTION OF THE PREFERRED EMBODIMENTS

First Embodiment

Figure 4:
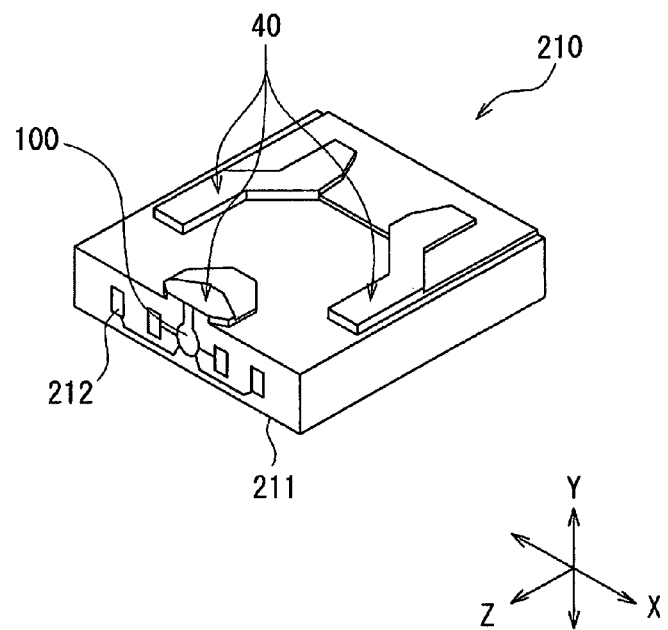
FIG. 4 is a perspective view showing a slider including the magnetic head according to the first embodiment of the invention.

Embodiments of the present invention will now be described in detail with reference to the drawings. First, with reference to FIG. 4, a description will be given of a slider 210 including a thin-film magnetic head (hereinafter, simply referred to as magnetic head) according to a first embodiment of the invention. The magnetic head according to the present embodiment is for use in perpendicular magnetic recording. In a magnetic recording device, the slider 210 is disposed to face a circular-plate-shaped recording medium (a magnetic disk) that is driven to rotate. In FIG. 4, the X direction is a direction across the tracks of the recording medium, i.e., the track width direction. The Y direction is a direction perpendicular to the surface of the recording medium. The Z direction is the direction of travel of the recording medium as viewed from the slider 210. The X, Y, and Z directions are orthogonal to one another. The slider 210 has a base body 211. The base body 211 is nearly hexahedron-shaped. One of the six surfaces of the base body 211 is designed to face the surface of the recording medium. At this one of the six surfaces, there is formed a medium facing surface 40 to face the recording medium. When the recording medium rotates and travels in the Z direction, an airflow passing between the recording medium and the slider 210 causes a lift below the slider 210 in the Y direction of FIG. 4. The lift causes the slider 210 to fly over the surface of the recording medium. The magnetic head 100 according to the present embodiment is formed near the air-outflow-side end (the end in the Z direction) of the slider 210. A plurality of terminals 212 are also provided at the air-outflow-side end of the slider 210.

A head assembly according to the present embodiment will now be described with reference to FIG. 5. The head assembly according to the present embodiment includes the slider 210 shown in FIG. 4 and a supporter that flexibly supports the slider 210. Forms of the head assembly include a head gimbal assembly and a head arm assembly described below.

A description will initially be given of the head gimbal assembly 220. The head gimbal assembly 220 includes the slider 210, and a suspension 221 serving as the supporter that flexibly supports the slider 210. The suspension 221 includes: a plate-spring-shaped load beam 222 formed of, e.g., stainless steel; a flexure 223 to which the slider 210 is joined, the flexure 223 being provided at an end of the load beam 222 and giving an appropriate degree of freedom to the slider 210; and a base plate 224 provided at the other end of the load beam 222. The base plate 224 is configured to be attached to an arm 230 of an actuator for moving the slider 210 along the X direction across the tracks of the recording medium 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 5:
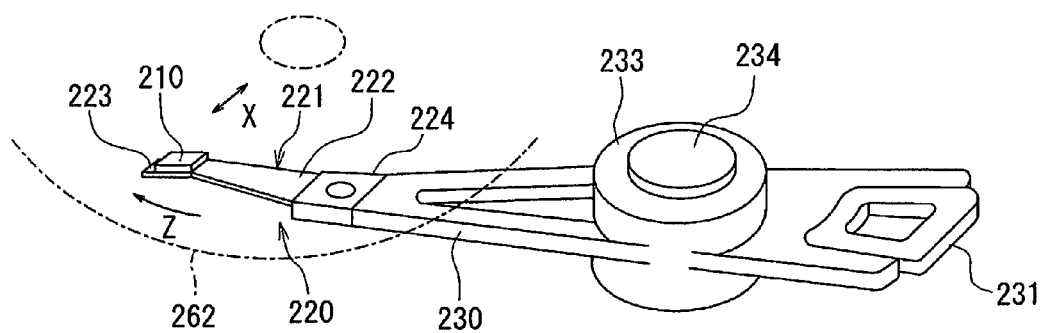
FIG. 5 is a perspective view showing a head arm assembly according to the first embodiment of the invention.

FIG. 5 shows the head arm assembly according to the present embodiment. In the head arm assembly, the head gimbal assembly 220 is attached to an end of the arm 230. A coil 231 that forms part of the voice coil motor is fixed to the other end of the arm 230. A bearing 233 is provided in the middle of the arm 230. The bearing 233 is attached to a shaft 234 for rotatably supporting the arm 230.

Figure 6:
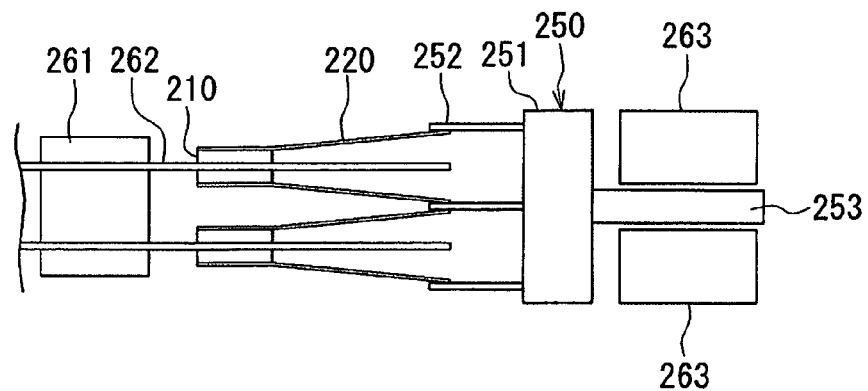
FIG. 6 is an explanatory diagram for illustrating the main part of a magnetic recording device according to the first embodiment of the invention.
Figure 7:
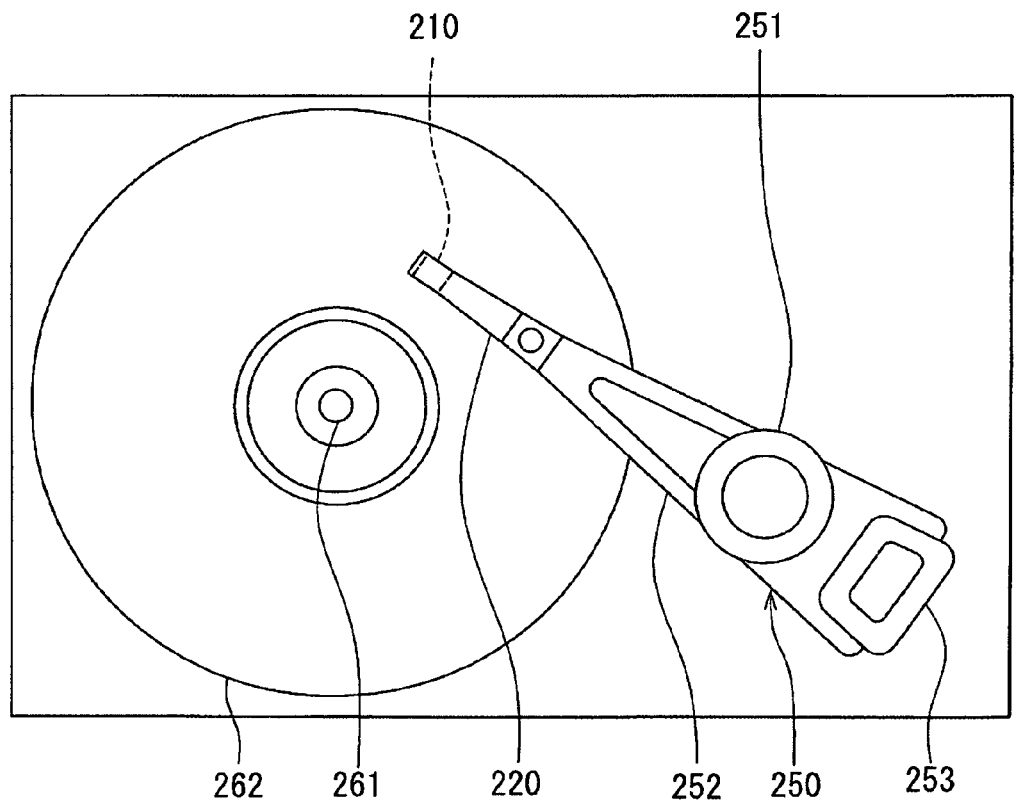
FIG. 7 is a plan view of the magnetic recording device according to the first embodiment of the invention.

Reference is now made to FIG. 6 and FIG. 7 to describe an example of the head stack assembly and a magnetic recording device according to the present embodiment. FIG. 6 is an explanatory diagram showing the main part of the magnetic recording device. FIG. 7 is a plan view of the magnetic recording device. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 that is part of the voice coil motor is mounted on a side of the carriage 251 opposite from the arms 252. The head stack assembly 250 is installed in the magnetic recording device. The magnetic recording device includes a plurality of recording media 262 mounted on a spindle motor 261. Two sliders 210 are allocated to each recording medium 262 such that the two sliders 210 are opposed to each other with the recording medium 262 interposed therebetween. The voice coil motor includes permanent magnets 263 arranged to be opposed to each other with the coil 253 of the head stack assembly 250 interposed therebetween. The actuator and the head stack assembly 250 except the sliders 210 support the sliders 210 and position them with respect to the recording media 262.

In the magnetic recording device according to the present embodiment, the actuator moves the slider 210 across the tracks of the recording medium 262 and positions the slider 210 with respect to the recording medium 262. The magnetic head included in the slider 210 writes data on the recording medium 262 with the write head, and reads data stored on the recording medium 262 with the read head.

Figure 2:
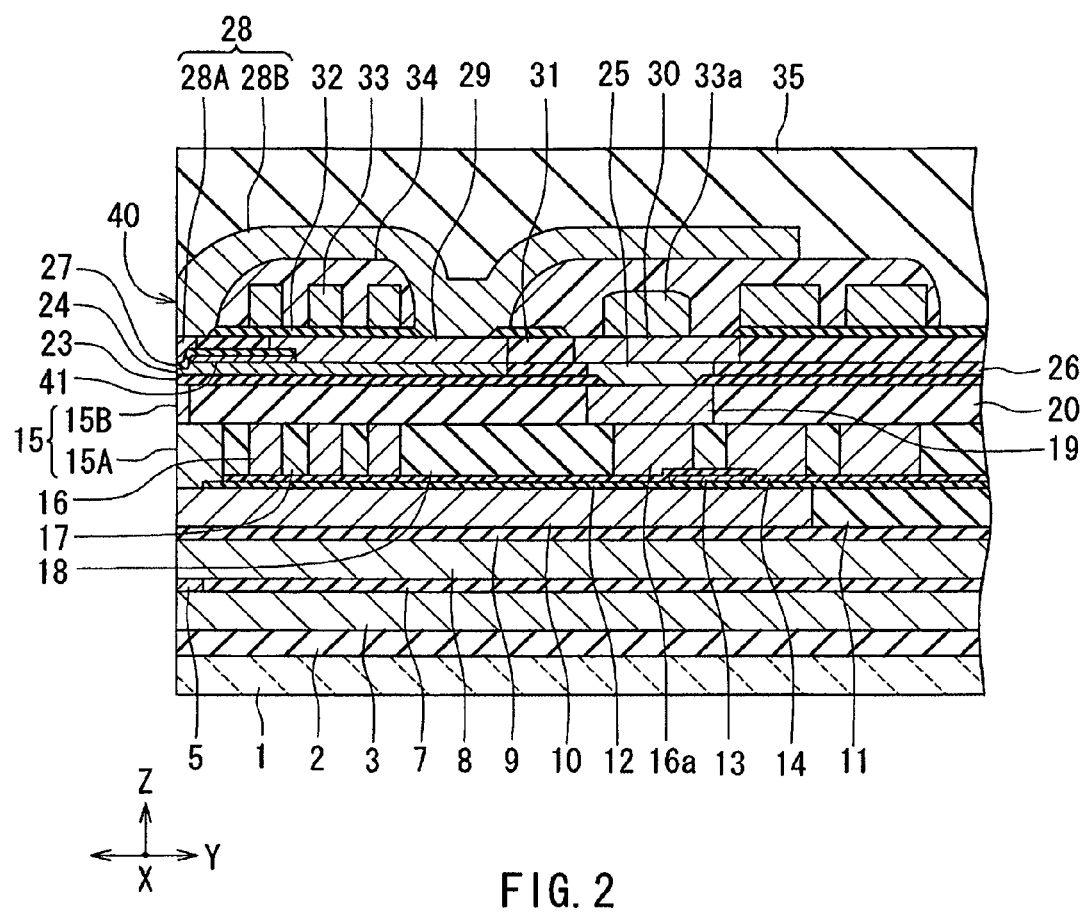
FIG. 2 is a cross-sectional view showing the configuration of a magnetic head according to the first embodiment of the invention.
Figure 3:
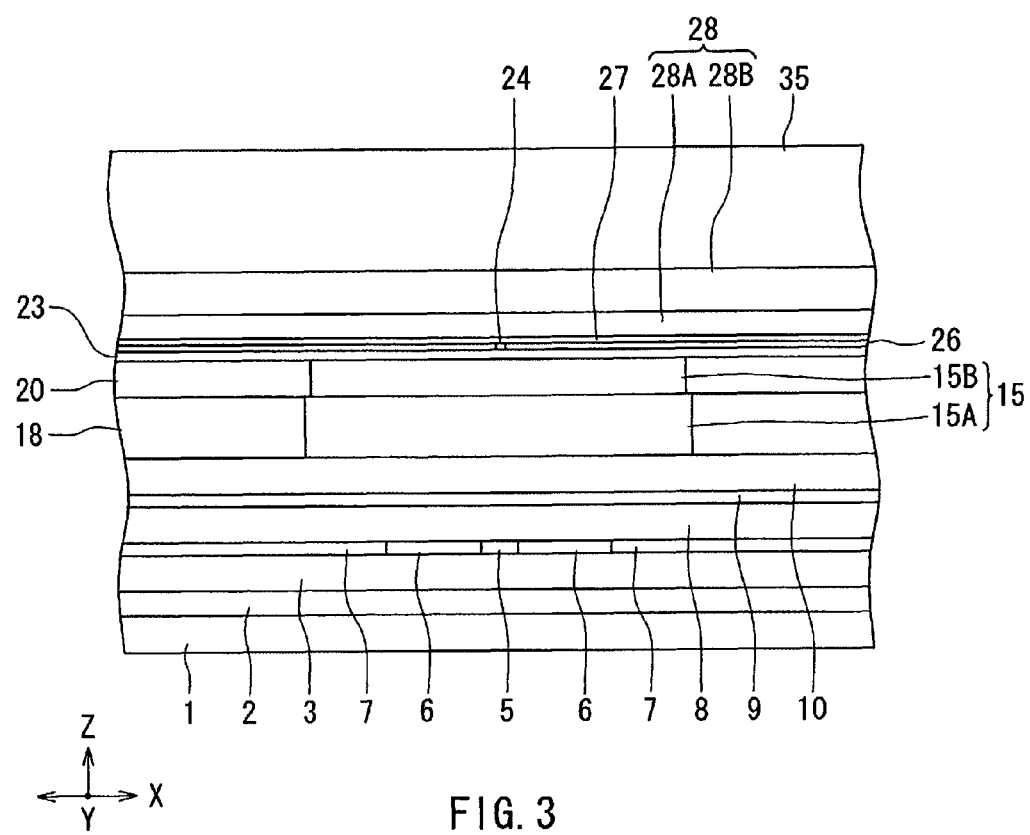
FIG. 3 is a front view showing the medium facing surface of the magnetic head according to the first embodiment of the invention.

Reference is now made to FIG. 2 and FIG. 3 to describe the configuration of the magnetic head according to the present embodiment. FIG. 2 is a cross-sectional view showing the configuration of the magnetic head. FIG. 3 is a front view showing the medium facing surface of the magnetic head. Note that FIG. 2 shows a cross section perpendicular to the medium facing surface and the top surface of the substrate. The X, Y, and Z directions shown in FIG. 4 are also shown in FIG. 2 and FIG. 3. In FIG. 2, the X direction is orthogonal to the Y and Z directions. In FIG. 3, the Y direction is orthogonal to the X and Z directions.

As shown in FIG. 2, the magnetic head according to the present embodiment has the medium facing surface 40 facing the recording medium. As shown in FIG. 2 and FIG. 3, the magnetic head includes: a substrate 1 made of a ceramic material such as aluminum oxide-titanium carbide ($Al_2O_3$—TiC); an insulating layer 2 made of an insulating material such as alumina ($Al_2O_3$) and disposed on the substrate 1; a first read shield 3 made of a magnetic material and disposed on the insulating layer 2; a magnetoresistive element (hereinafter referred to as MR element) 5 disposed on the first read shield 3; two bias magnetic field applying layers 6 disposed to adjoin two sides of the MR element 5 that are opposite in the track width direction (X direction in FIG. 3); and an insulating refill layer 7 disposed around the MR element 5 and the bias magnetic field applying layers 6. The insulating refill layer 7 is made of an insulating material such as alumina.

The magnetic head further includes a second read shield 8 made of a magnetic material and disposed over the MR element 5, the bias magnetic field applying layers 6 and the insulating refill layer 7, and a separating layer 9 made of a nonmagnetic material such as alumina and disposed on the second read shield 8. The parts from the first read shield 3 to the second read shield 8 constitute the read head.

The magnetic head further includes a sub-shield 10 made of a magnetic material and disposed on the separating layer 9, and an insulating layer 11 made of an insulating material such as alumina and disposed around the sub-shield 10. The sub-shield 10 has an end face located in the medium facing surface 40. The top surfaces of the sub-shield 10 and the insulating layer 11 are made even with each other.

The magnetic head further includes an insulating film 12 disposed over the sub-shield 10 and the insulating layer 11, a heater 13 disposed on the insulating film 12, and an insulating film 14 disposed over the insulating film 12 and the heater 13 so that the heater 13 is interposed between the insulating films 12 and 14. The function and material of the heater 13 will be described later. The insulating films 12 and 14 are each made of an insulating material such as alumina.

The magnetic head further includes a first write shield 15 disposed on the sub-shield 10. The first write shield 15 includes a first layer 15A disposed on the sub-shield 10, and a second layer 15B disposed on the first layer 15A. The first layer 15A and the second layer 15B are each made of a magnetic material. The first layer 15A and the second layer 15B have their respective end faces located in the medium facing surface 40. In the example shown in FIG. 2, the length of the second layer 15B in the direction perpendicular to the medium facing surface 40 (Y direction in FIG. 2) is smaller than that of the first layer 15A in the direction perpendicular to the medium facing surface 40. However, the length of the second layer 15B in the direction perpendicular to the medium facing surface 40 may be equal to or greater than that of the first layer 15A in the direction perpendicular to the medium facing surface 40.

The magnetic head further includes a coil 16 made of a conductive material and disposed on the insulating film 14, an insulating layer 17 that fills the space between the coil 16 and the first layer 15A and the space between every adjacent turns of the coil 16, and an insulating layer 18 disposed around the first layer 15A, the coil 16 and the insulating layer 17. The coil 16 is planar spiral-shaped. The coil 16 includes a connecting portion 16a which is a portion near the inner end of the coil 16 and connected to another coil described later. The insulating layer 17 is made of a photoresist, for example. The insulating layer 18 is made of alumina, for example. The top surfaces of the first layer 15A, the coil 16, the insulating layer 17, and the insulating layer 18 are made even with each other.

The magnetic head further includes a connecting layer 19 made of a conductive material and disposed on the connecting portion 16a, and an insulating layer 20 made of an insulating material such as alumina and disposed around the second layer 15B and the connecting layer 19. The connecting layer 19 may be made of the same material as that of the second layer 15B. The top surfaces of the second layer 15B, the connecting layer 19, and the insulating layer 20 are made even with each other.

The magnetic head further includes a first gap layer 23 disposed over the second layer 15B, the connecting layer 19 and the insulating layer 20. The first gap layer 23 has an opening formed in the area corresponding to the top surface of the connecting layer 19. The first gap layer 23 is made of a nonmagnetic insulating material such as alumina.

The magnetic head further includes a pole layer 24 made of a magnetic material and disposed on the first gap layer 23, a connecting layer 25 made of a conductive material and disposed on the connecting layer 19, and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as that of the pole layer 24.

The magnetic head further includes a nonmagnetic layer 41 made of a nonmagnetic material and disposed on part of the top surface of the pole layer 24. The nonmagnetic layer 41 is made of an inorganic insulating material or a metal material, for example. Examples of the inorganic insulating material to be used for the nonmagnetic layer 41 include alumina and $SiO_2$. Examples of the metal material to be used for the nonmagnetic layer 41 include Ru and Ti.

The magnetic head further includes a second gap layer 27 disposed over a part of the pole layer 24 and the nonmagnetic layer 41. A part of the top surface of the pole layer 24 away from the medium facing surface 40 and the top surface of the connecting layer 25 are not covered with the nonmagnetic layer 41 and the second gap layer 27. The second gap layer 27 is made of a nonmagnetic material such as alumina.

The magnetic head further includes a second write shield 28 disposed on the second gap layer 27. The second write shield 28 includes a first layer 28A disposed to adjoin the second gap layer 27, and a second layer 28B disposed on a side of the first layer 28A opposite from the second gap layer 27 and connected to the first layer 28A. The first layer 28A and the second layer 28B are each made of a magnetic material. The first layer 28A and the second layer 28B have their respective end faces located in the medium facing surface 40.

The magnetic head further includes a yoke layer 29 made of a magnetic material and disposed on a part of the pole layer 24 away from the medium facing surface 40, a connecting layer 30 made of a conductive material and disposed on the connecting layer 25, and an insulating layer 31 made of an insulating material such as alumina and disposed around the first layer 28A, the yoke layer 29 and the connecting layer 30. The yoke layer 29 and the connecting layer 30 may be made of the same material as that of the first layer 28A. The top surfaces of the first layer 28A, the yoke layer 29, the connecting layer 30 and the insulating layer 31 are made even with each other.

The magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a part of the top surface of the yoke layer 29 near an end thereof farther from the medium facing surface 40, and an opening for exposing the top surface of the connecting layer 30.

The magnetic head further includes a coil 33 made of a conductive material and disposed on the insulating layer 32. The coil 33 is planar spiral-shaped. The coil 33 includes a connecting portion 33a which is a portion near the inner end of the coil 33 and connected to the connecting portion 16a of the coil 16. The connecting portion 33a is connected to the connecting layer 30, and is connected to the connecting portion 16a via the connecting layers 19, 25, and 30.

The magnetic head further includes an insulating layer disposed to cover the coil 33. The insulating layer is made of a photoresist, for example. The second layer 28B of the second write shield 28 is disposed over the first layer 28A, the yoke layer 29 and the insulating layer 34, and connects the first layer 28A and the yoke layer 29 to each other.

The magnetic head further includes an overcoat layer 35 made of an insulating material such as alumina and disposed to cover the second layer 28B. The parts from the sub-shield 10 to the second layer 28B constitute the write head. The base body 211 of FIG. 4 is mainly composed of the substrate 1 and the overcoat layer 35 of FIG. 2.

As has been described, the magnetic head has the medium facing surface 40 facing the recording medium, and includes the read head and the write head. The read head and the write head are stacked on the substrate 1. The read head is disposed backward along the direction of travel of the recording medium (Z direction) (in other words, disposed closer to the air-inflow end of the slider), while the write head is disposed forward along the direction of travel of the recording medium (Z direction) (in other words, disposed closer to the air-outflow end of the slider). The magnetic head writes data on the recording medium with the write head, and reads data stored on the recording medium with the read head. The configuration of the read head will be described in detail later.

The write head includes the sub-shield 10, the first write shield 15, the coil 16, the first gap layer 23, the pole layer 24, the nonmagnetic layer 41, the second gap layer 27, the second write shield 28, the yoke layer 29, and the coil 33. The first write shield 15 is located closer to the substrate 1 than is the second write shield 28. The pole layer 24 is located closer to the substrate 1 than is the second write shield 28.

The coils 16 and 33 produce a magnetic field that corresponds to data to be written on the recording medium. The pole layer 24 has an end face located in the medium facing surface 40, allows a magnetic flux corresponding to the magnetic field produced by the coils 16 and 33 to pass, and produces a write magnetic field to be used for writing the data on the recording medium by means of the perpendicular magnetic recording system.

The first write shield 15 is made of a magnetic material, and has an end face located in the medium facing surface 40 at a position backward of the end face of the pole layer 24 along the direction of travel of the recording medium (Z direction). The first gap layer 23 is made of a nonmagnetic material, has an end face located in the medium facing surface 40, and is disposed between the first write shield 15 and the pole layer 24. In the present embodiment, the first write shield 15 includes the first layer 15A disposed on the sub-shield 10 and the second layer 15B disposed on the first layer 15A. Part of the coil 16 is located on a side of the first layer 15A so as to pass through the space between the sub-shield 10 and the pole layer 24.

The sub-shield 10 has the function of returning a magnetic flux that has been generated from the end face of the pole layer 24 and has magnetized the recording medium. FIG. 2 shows an example where the sub-shield 10 has an end face located in the medium facing surface 40. Alternatively, the sub-shield 10 may have an end face that is closer to the medium facing surface 40 and located at a distance from the medium facing surface 40, since the sub-shield 10 is connected to the first write shield 15 having an end face located in the medium facing surface 40.

In the medium facing surface 40, the end face of the first write shield 15 (the end face of the second layer 15B) is located backward of the end face of the pole layer 24 along the direction of travel of the recording medium (Z direction) (in other words, located closer to the air-inflow end of the slider) with a predetermined small distance provided therebetween by the first gap layer 23. The distance between the end face of the pole layer 24 and the end face of the first write shield 15 in the medium facing surface 40 is preferably in the range of 0.05 to 0.7 μm, or more preferably in the range of 0.1 to 0.3 μm.

The first write shield 15 takes in a magnetic flux that is generated from the end face of the pole layer 24 located in the medium facing surface 40 and that expands in directions other than the direction perpendicular to the plane of the recording medium, and thereby prevents the flux from reaching the recording medium. It is thereby possible to improve the recording density.

The second write shield 28 is made of a magnetic material, and has an end face located in the medium facing surface 40 at a position forward of the end face of the pole layer 24 along the direction of travel of the recording medium (Z direction). The second gap layer 27 is made of a nonmagnetic material, has an end face located in the medium facing surface 40, and is disposed between the second write shield 28 and the pole layer 24. In the present embodiment, the second write shield 28 includes the first layer 28A disposed to adjoin the second gap layer 27, and the second layer 28B disposed on a side of the first layer 28A opposite from the second gap layer 27 and connected to the first layer 28A. Part of the coil 33 is arranged to pass through the space surrounded by the pole layer 24 and the second write shield 28. The second write shield 28 is connected to a part of the yoke layer 29 away from the medium facing surface 40. The second write shield 28 is thus connected to a part of the pole layer 24 away from the medium facing surface 40 via the yoke layer 29. The pole layer 24, the second write shield 28, and the yoke layer 29 form a magnetic path that passes a magnetic flux corresponding to the magnetic field produced by the coil 33.

In the medium facing surface 40, the end face of the second write shield 28 (the end face of the first layer 28A) is located forward of the end face of the pole layer 24 along the direction of travel of the recording medium (Z direction) (in other words, located closer to the air-outflow end of the slider) with a predetermined small distance provided therebetween by the second gap layer 27. The distance between the end face of the pole layer 24 and the end face of the second write shield 28 in the medium facing surface 40 is preferably equal to or smaller than 200 nm, or more preferably in the range of 25 to 50 nm, so that the second write shield 28 can fully exhibit its shield function.

The position of the end of a bit pattern to be written on the recording medium depends on the position of an end of the pole layer 24 in the medium facing surface 40, the end being closer to the second gap layer 27. The second write shield 28 takes in a magnetic flux that is generated from the end face of the pole layer 24 located in the medium facing surface 40 and that expands in directions other than the direction perpendicular to the plane of the recording medium, and thereby prevents the flux from reaching the recording medium. It is thereby possible to improve the recording density. The second write shield 28 also takes in a disturbance magnetic field that is applied to the magnetic head from the outside thereof. It is thereby possible to prevent erroneous writing on the recording medium caused by the disturbance magnetic field intensively taken into the pole layer 24. The second write shield 28 also has the function of returning a magnetic flux that has been generated from the end face of the pole layer 24 and has magnetized the recording medium.

FIG. 2 shows an example where neither the sub-shield 10 nor the first write shield 15 is connected to the pole layer 24. Nevertheless, the sub-shield 10 may be connected to a part of the pole layer 24 away from the medium facing surface 40. The coil 16 is not an essential component of the write head and can be dispensed with. In the example shown in FIG. 2, the yoke layer 29 is disposed on the pole layer 24, that is, disposed forward of the pole layer 24 along the direction of travel of the recording medium (Z direction) (in other words, disposed closer to the air-outflow end of the slider). Alternatively, the yoke layer 29 may be disposed below the pole layer 24, that is, backward of the pole layer 24 along the direction of travel of the recording medium (Z direction) (in other words, closer to the air-inflow end of the slider).

The heater 13 is provided for heating the components of the write head including the pole layer 24 so as to control the distance between the recording medium and the end face of the pole layer 24 located in the medium facing surface 40. Two not-shown leads are connected to the heater 13. The heater 13 is formed of an NiCr film or a layered film composed of a Ta film, an NiCu film and a Ta film, for example. The heater 13 generates heat by being energized through the two leads, and thereby heats the components of the write head. As a result, the components of the write head expand and the end face of the pole layer 24 located in the medium facing surface 40 thereby gets closer to the recording medium.

While FIG. 2 and FIG. 3 show a write head for use in the perpendicular magnetic recording system, the write head of the present embodiment may be one for use in the longitudinal magnetic recording system.

A method of manufacturing the magnetic head according to the present embodiment will now be outlined. In the method of manufacturing the magnetic head according to the embodiment, components of a plurality of magnetic heads are initially formed on a single substrate (wafer) to fabricate a substructure that includes a plurality of rows of pre-slider portions, the pre-slider portions being intended to become individual sliders later. Next, the substructure is cut into a slider aggregate that includes a row of pre-slider portions. Next, a surface formed in the slider aggregate by the cutting of the substructure is polished into the medium facing surfaces 40 of the pre-slider portions included in the slider aggregate. Next, flying rails are formed in the medium facing surfaces 40. The slider aggregate is then cut so as to separate the plurality of pre-slider portions from one another. This forms a plurality of sliders that respectively include the magnetic heads.

Figure 1:
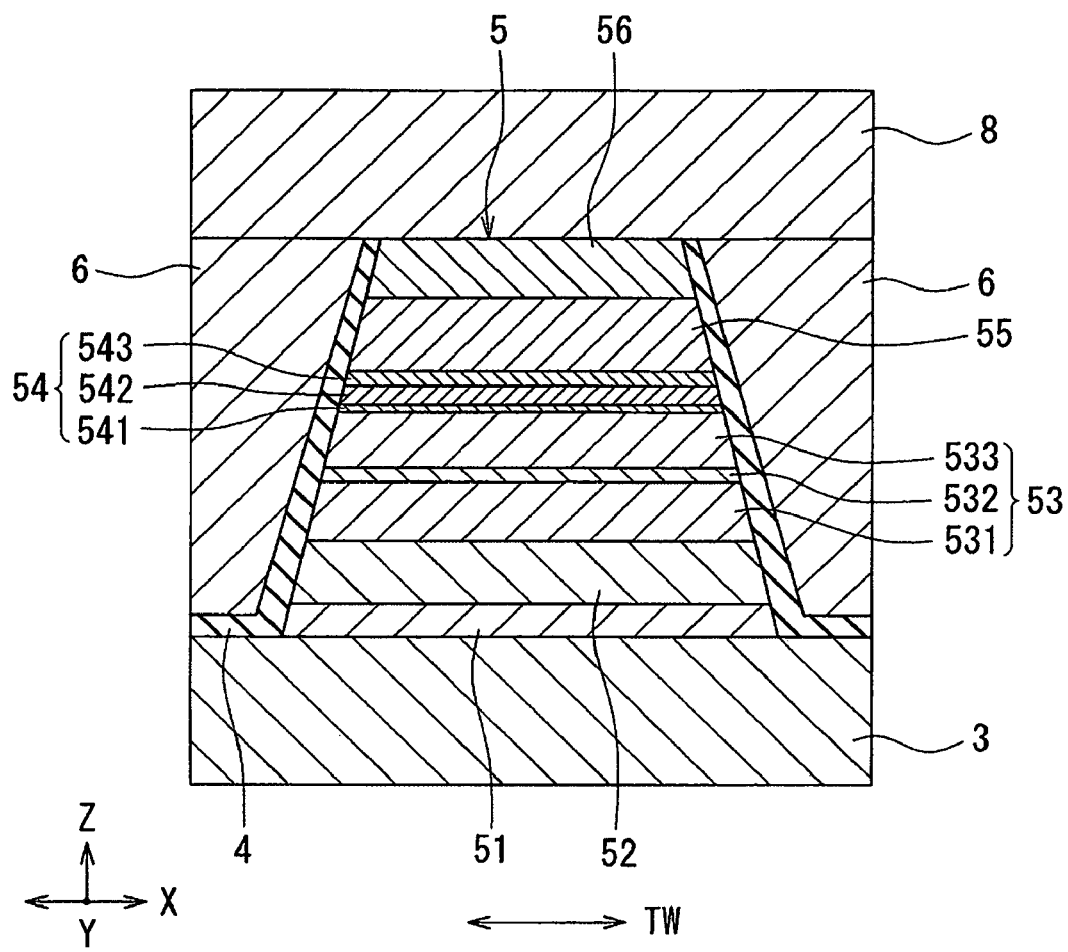
FIG. 1 is a cross-sectional view showing a cross section of a read head including a magnetoresistive element according to a first embodiment of the invention, the cross section being parallel to the medium facing surface.

Now, with reference to FIG. 1, a detailed description will be given of the configuration of the read head including the MR element 5 according to the present embodiment. FIG. 1 is a cross-sectional view showing a cross section of the read head parallel to the medium facing surface 40. The X, Y, and Z directions shown in FIG. 4 are also shown in FIG. 1. In FIG. 1, the Y direction is orthogonal to the X and Z directions. The arrow with the symbol TW in FIG. 1 indicates the track width direction. The track width direction TW is the same as the X direction.

The read head includes the first read shield 3 and the second read shield 8 disposed at a distance from each other, and the MR element 5 disposed between the first read shield 3 and the second read shield 8. The MR element 5 and the second read shield 8 are stacked in this order on the first read shield 3.

The read head further includes the two bias magnetic field applying layers 6 and an insulating layer 4. The two bias magnetic field applying layers 6 are disposed to adjoin the two sides of the MR element 5 and apply a bias magnetic field to the MR element 5. The insulating layer 4 is interposed between the first read shield 3 and each of the bias magnetic field applying layers 6 and between the MR element 5 and each of the bias magnetic field applying layers 6.

The bias magnetic field applying layers 6 are each formed of a hard magnetic layer (hard magnet) or a stack of a ferromagnetic layer and an antiferromagnetic layer. Specifically, the bias magnetic field applying layers 6 are formed of CoPt or CoCrPt, for example. The insulating layer 4 is formed of alumina, for example.

The MR element 5 according to the present embodiment is a CPP-GMR element. A sense current, which is a current for magnetic signal detection, is fed to the MR element 5 in a direction intersecting the planes of layers constituting the MR element 5, such as the direction perpendicular to the planes of the layers constituting the MR element 5. The first read shield 3 and the second read shield 8 also function as a pair of electrodes for feeding the sense current to the MR element 5 in a direction intersecting the planes of the layers constituting the MR element 5, such as the direction perpendicular to the planes of the layers constituting the MR element 5. Aside from the first read shield 3 and the second read shield 8, a pair of electrodes may be provided on top and bottom of the MR element 5. The MR element 5 changes in resistance in response to an external magnetic field, that is, a signal magnetic field sent from the recording medium. The resistance of the MR element 5 can be determined from the sense current. It is thus possible, with the read head, to read data stored on the recording medium.

FIG. 1 shows an example of the configuration of the MR element 5. The MR element 5 includes a free layer 55, a pinned layer 53, and a spacer layer 54. The free layer 55 is a ferromagnetic layer whose direction of magnetization changes in response to a signal magnetic field which is an external magnetic field. The pinned layer 53 is a ferromagnetic layer whose direction of magnetization is pinned. The spacer layer 54 is disposed between the free layer 55 and the pinned layer 53. The free layer 55 corresponds to a first ferromagnetic layer according to the present invention. The pinned layer 53 corresponds to a second ferromagnetic layer according to the present invention. In the example shown in FIG. 1, the pinned layer 53 is located closer to the first read shield 3 than is the free layer 55. Alternatively, contrary to this example, the free layer 55 may be located closer to the first read shield 3. The MR element 5 further includes an antiferromagnetic layer 52, an underlayer 51, and a protection layer 56. The antiferromagnetic layer 52 is disposed on a side of the pinned layer 53 opposite from the spacer layer 54. The underlayer 51 is disposed between the first read shield 3 and the antiferromagnetic layer 52. The protection layer 56 is disposed between the free layer 55 and the second read shield 8. In the MR element 5 shown in FIG. 1, the underlayer 51, the antiferromagnetic layer 52, the pinned layer 53, the spacer layer 54, the free layer 55, and the protection layer 56 are stacked in this order on the first read shied 3.

The antiferromagnetic layer 52 is intended for pinning the direction of magnetization of the pinned layer 53 by means of exchange coupling with the pinned layer 53. The underlayer 51 is intended for improving the crystallinity and orientability of the layers to be formed thereon and for enhancing the exchange coupling between the antiferromagnetic layer 52 and the pinned layer 53, in particular. The protection layer 56 is intended for protecting the layers located thereunder.

The underlayer 51 has a thickness of 2 to 6 nm, for example. The underlayer 51 is formed of a stack of a Ta layer and a Ru layer, for example.

The antiferromagnetic layer 52 has a thickness of 5 to 30 nm, for example. The antiferromagnetic layer 52 is made of an antiferromagnetic material that contains Mn and at least one element $M_{II}$ selected from the group consisting of Pt, Ru, Rh, Pd, Ni, Cu, Ir, Cr, and Fe, for example. The antiferromagnetic material preferably contains 35 to 95 atomic % Mn, and 5 to 65 atomic % of the other element(s) $M_{II}$. Antiferromagnetic materials are categorizable into two types: one is a non-heat-induced antiferromagnetic material which exhibits antiferromagnetism without any heat treatment and induces an exchange coupling magnetic field between itself and a ferromagnetic material; and the other is a heat-induced antiferromagnetic material which exhibits antiferromagnetism by undergoing heat treatment. Either of the two types can be used for the antiferromagnetic layer 52. Examples of the non-heat-induced antiferromagnetic materials include Mn alloys that have a γ phase, such as RuRhMn, FeMn, and IrMn. Examples of the heat-induced antiferromagnetic materials include Mn alloys that have a regular crystal structure, such as PtMn, NiMn, and PtRhMn.

As a layer for pinning the direction of magnetization of the pinned layer 53, a hard magnetic layer made of a hard magnetic material such as CoPt may be provided instead of the foregoing antiferromagnetic layer 52. In such a case, Cr, CrTi, TiW or the like is selected as the material of the underlayer 51.

The direction of magnetization of the pinned layer 53 is pinned by exchange coupling between the pinned layer 53 and the antiferromagnetic layer 52 at the interface therebetween. The pinned layer 53 of the present embodiment is a so-called synthetic pinned layer, having an outer layer 531, a nonmagnetic middle layer 532, and an inner layer 533 that are stacked in this order on the antiferromagnetic layer 52. Each of the outer layer 531 and the inner layer 533 includes a ferromagnetic layer made of a ferromagnetic material that contains at least Co selected from the group consisting of Co and Fe, for example. The outer layer 531 and the inner layer 533 are antiferromagnetically coupled to each other, whereby their directions of magnetization are pinned to mutually opposite directions. The outer layer 531 has a thickness of 3 to 7 nm, for example. The inner layer 533 has a thickness of 3 to 10 nm, for example.

The nonmagnetic middle layer 532 has a thickness of 0.35 to 1.0 nm, for example. The nonmagnetic middle layer 532 is made of a nonmagnetic material that contains at least one element selected from the group consisting of Ru, Rh, Ir, Re, Cr, Zr, and Cu, for example. The nonmagnetic middle layer 532 is intended for causing antiferromagnetic exchange coupling between the inner layer 533 and the outer layer 531, thereby pinning the magnetizations of the inner layer 533 and the outer layer 531 to mutually opposite directions. It should be noted that the state where the magnetizations of the inner layer 533 and the outer layer 531 are in mutually opposite directions includes not only the state where the two directions of magnetization differ from each other by 180°, but also the states where the two directions of magnetization differ by 180°±20°.

The spacer layer 54 of the present embodiment includes a nonmagnetic metal layer 541, a first oxide semiconductor layer 542, and a second oxide semiconductor layer 543 that are stacked in this order on the pinned layer 53 (inner layer 533). The nonmagnetic metal layer 541 is made of Cu, and has a thickness in the range of 0.3 to 1.5 nm. The first oxide semiconductor layer 542 is made of a Ga oxide semiconductor, and has a thickness in the range of 0.5 to 2.0 nm. The second oxide semiconductor layer 543 is made of a Zn oxide semiconductor, and has a thickness in the range of 0.1 to 1.0 nm. The top surface of the second oxide semiconductor layer 543 is in contact with the bottom surface of the free layer 55. The Ga oxide semiconductor may be $Ga_2O_3$. The Zn oxide semiconductor may be ZnO.

$Ga_2O_3$, the material of the first oxide semiconductor layer 542, and ZnO, the material of the second oxide semiconductor layer 543, are both oxide semiconductors. $Ga_2O_3$ for use for the first oxide semiconductor layer 542 may be crystalline or amorphous. $Ga_2O_3$ for use for the first oxide semiconductor layer 542 may have a composition somewhat different from its stoichiometric composition.

The free layer 55 has a thickness of 2 to 10 nm, for example. The free layer 55 is formed of a ferromagnetic layer that has a low coercivity. The free layer 55 may include a plurality of stacked ferromagnetic layers.

The protection layer 56 has a thickness of 0.5 to 20 nm, for example. The protection layer 56 may be formed of a Ta layer or a Ru layer. The protection layer 56 may have a two-layer structure consisting of Ta and Ru layers, for example, or a three-layer structure consisting of Ta, Ru and Ta layers or Ru, Ta and Ru layers, for example.

At least one of the inner layer 533 and the free layer 55 may include a Heusler alloy layer.

The magnitude of the resistance of the MR element 5 is appropriately evaluated in terms of the resistance-area product (hereinafter, also referred to as RA) of the MR element 5. If the RA of the MR element 5 is too small, there arises the problem that the MR change ratio decreases and the current density in the MR element 5 becomes so high as to increase spin torque in the pinned layer 53 or the free layer 55. The spin torque refers to a torque that is generated by spin-polarized electrons injected from the free layer 55 into the pinned layer 53 or from the pinned layer 53 into the free layer 55 and rotates the magnetization of the pinned layer 53 or the free layer 55. If the RA of the MR element 5 is too large, on the other hand, the high-frequency response of the read head is degraded and noise increases. It is preferred that the RA of the MR element 5 fall within the range of 0.1 to 0.3 $\Omega \cdot \mu m^2$.

A method of manufacturing the read head shown in FIG. 1 will now be described. In the method of manufacturing the read head, the first read shield 3 is initially formed into a predetermined pattern on the insulating layer 2 by plating or the like. On the first read shield 3, films to become the respective layers of the MR element 5 are formed in succession by, for example, sputtering, whereby a stack of such films is formed. Next, the stack is subjected to annealing for heating at a predetermined temperature. The annealing temperature preferably falls within the range of 200° C. to 300° C. Next, the stack is etched and thereby patterned into the MR element 5. Next, the insulating layer 4 and the bias magnetic field applying layers 6 are formed in succession by sputtering, for example. Next, the second read shield 8 is formed over the MR element 5 and the bias magnetic field applying layers 6 by plating or sputtering, for example.

The annealing mentioned above is needed for promoting the crystallization of the oxide semiconductor layers 542 and 543 of the spacer layer 54 to lower the resistance of the spacer layer 54, and thereby making the RA of the MR element 5 fall within a desired range. The annealing therefore may be performed at any stage after the formation of the films that are to become the respective layers of the spacer layer 54. For example, the annealing may be performed after the patterning of the foregoing stack. The annealing may be performed with a magnetic field applied to the stack, in which case the annealing also serves to set the directions of magnetization of the outer layer 531 and the inner layer 533 of the pinned layer 53.

The operation of the thin-film magnetic head according to the present embodiment will now be described. The thin-film magnetic head writes data on a recording medium with the write head, and reads data stored on the recording medium with the read head.

In the read head, the bias magnetic field applying layers 6 produce a bias magnetic field in the same direction as the track width direction TW. When the MR element 5 is subjected to no signal magnetic field, the direction of magnetization of the free layer 55 follows the direction of the bias magnetic field. On the other hand, the direction of magnetization of the pinned layer 53 is pinned to the direction perpendicular to the medium facing surface 40.

In the MR element 5, the direction of magnetization of the free layer 55 changes in response to a signal magnetic field sent from the recording medium. This causes a change in the relative angle between the direction of magnetization of the free layer 55 and that of the pinned layer 53. As a result, the resistance of the MR element 5 changes. The resistance of the MR element 5 can be determined from the potential difference between the first and second read shields 3 and 8 produced when a sense current is fed to the MR element 5 from the read shields 3 and 8. It is thus possible, with the read head, to read data stored on the recording medium.

In the MR element 5 according to the present embodiment, the spacer layer 54 includes the nonmagnetic metal layer 541, the first oxide semiconductor layer 542, and the second oxide semiconductor layer 543 stacked in this order. According to the present embodiment, it is possible to make the RA of the MR element 5 greater than that in the case where the spacer layer 54 consists only of a nonmagnetic metal layer, and to make the RA of the MR element 5 smaller than that in the case where the spacer layer 54 is formed of an insulating layer as with a TMR element. The nonmagnetic metal layer 541 has the function of preventing oxidation of one of the ferromagnetic layers that is in contact with the spacer layer 54, i.e., the pinned layer 53 (inner layer 533), thereby preventing the characteristic degradation of the pinned layer 53 (inner layer 533). The nonmagnetic metal layer 541, the first oxide semiconductor layer 542, and the second oxide semiconductor layer 543 have thicknesses in respective ranges which have been determined from experimental results to be described below.

Hereinafter, a description will be given of the results of an experiment that was performed to determine the preferred configuration of the spacer layer 54 of the MR element 5. In the experiment, a plurality of samples of the MR element with the spacer layer 54 of different compositions were fabricated and measured for the MR change ratio (%) and RA ($\Omega \cdot \mu m^2$). Table 1 below shows the configurations of the samples.

TABLE 1

| Configuration of the sample | | Material | Thickness (nm) |
|---|---|---|---|
| Protection layer 56 | | Ru | 2 |
| | | Ta | 2.5 |
| | | Ru | 8 |
| Free layer 55 | | NiFe | 5 |
| | | CoFeB | 1 |
| | | CoFe | 1 |

TABLE 1-continued

| Configuration of the sample | | Material | Thickness (nm) |
|---|---|---|---|
| Spacer layer 54 | Second oxide semiconductor layer 543 | ZnO | T3 |
| | First oxide semiconductor layer 542 | $Ga_2O_3$ | T2 |
| | Nonmagnetic metal layer 541 | Cu | T1 |
| Pinned layer 53 | Inner layer 533 | CoFe | 3.5 |
| | Nonmagnetic middle layer 532 | Ru | 0.8 |
| | Outer layer 531 | CoFe | 4 |
| Antiferromagnetic layer 52 | | IrMn | 5.5 |
| Underlayer 51 | | Ru | 2 |
| | | Ta | 1 |

The thickness T1 of the nonmagnetic metal layer 541, the thickness T2 of the first oxide semiconductor layer 542, and the thickness T3 of the second oxide semiconductor layer 543 were varied from one sample to another. The plurality of samples fabricated for the experiment include a plurality of samples of a first comparative example and a plurality of samples of a second comparative example with the following configurations. In the plurality of samples of the first comparative example, the spacer layer 54 was composed only of the nonmagnetic metal layer 541 and the second oxide semiconductor layer 543 formed thereon, without the first oxide semiconductor layer 542 (T2=0). In the plurality of samples of the second comparative example, the spacer layer 54 was composed only of the nonmagnetic metal layer 541 and the first oxide semiconductor layer 542 formed thereon, without the second oxide semiconductor layer 543 (T3=0). In plurality of samples fabricated for the experiment except the samples of the first and second comparative examples, the spacer layer 54 was composed of the nonmagnetic metal layer 541, the first oxide semiconductor layer 542, and the second oxide semiconductor layer 543.

Each sample was fabricated in the following way, using a DC sputtering system. On a substrate made of aluminum oxide-titanium carbide, the layers shown in Table 1 were deposited successively from the bottom, whereby a stack was formed. The stack was then patterned by etching, and further subjected to annealing. The deposition rate of the first oxide semiconductor layer 542 was 0.0039 nm/sec. The deposition rate of the second oxide semiconductor layer 543 was 0.0124 nm/sec. As viewed from above, each sample had a square shape with a width of 200 nm and a length of 200 nm. It should be noted that the "width" refers to the length in the track width direction, and the "length" refers to the length in the direction perpendicular to the medium facing surface 40. The annealing of the stack was performed at a temperature of 250° C. for three hours while applying a magnetic field of 10 kOe (1 Oe=79.6 A/m) to the stack. Each sample was measured for the MR change ratio and RA by using the direct-current four-probe method.

In the samples of the first and second comparative examples, the nonmagnetic metal layer 541 was given a thickness T1 of 0.8 nm. This is for the purpose of evaluating the characteristics of the plurality of samples other than the samples of the first and second examples, using the characteristics of the samples of the first and second comparative examples as reference. More specifically, as will be shown later, at least when T1 was 0.8 nm, the plurality of samples other than the samples of the first and second comparative examples showed a high MR change ratio of 20% or higher with RA in the range of 0.1 to 0.3 $\Omega \cdot \mu m^2$ and with T2 and T3 within specific ranges. The value of 0.8 nm is thus considered to be one of preferred values of T1.

Figure 8:
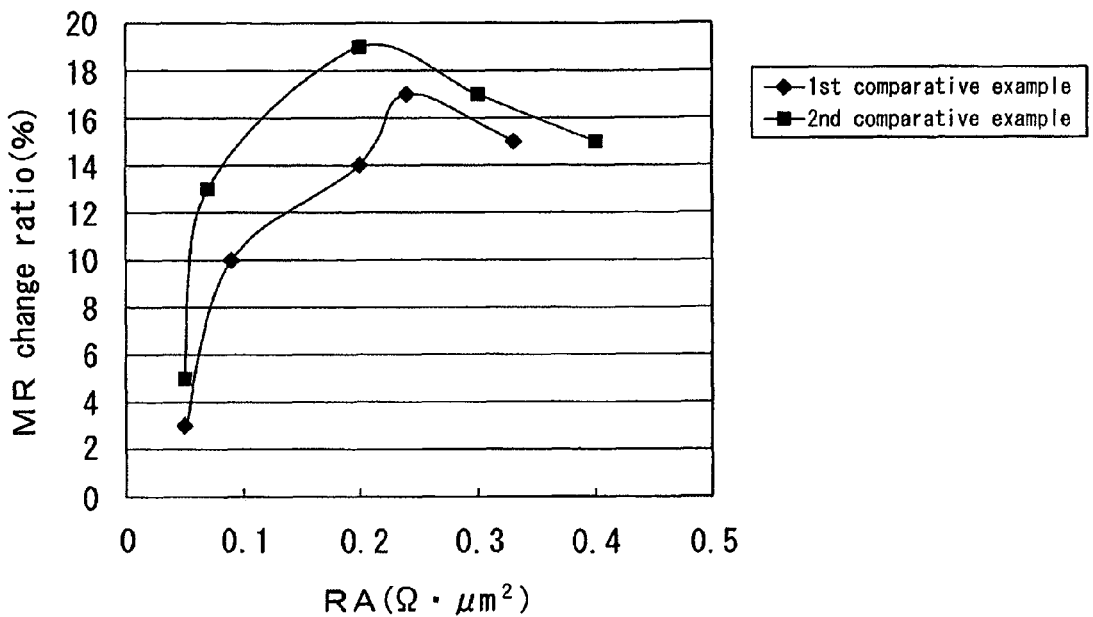
FIG. 8 is a characteristic chart showing the results of an experiment performed for determining a preferable configuration of the spacer layer.

Table 2 shows the MR change ratio and the RA of each of the plurality of samples of the first comparative example. Table 3 shows the MR change ratio and the RA of each of the plurality of samples of the second comparative example. FIG. 8 shows the relationship between the MR change ratio and the RA for the plurality of samples of the first and second comparative examples.

TABLE 2

| ZnO T3 (nm) | MR change ratio (%) | RA ($\Omega \cdot \mu m^2$) |
|---|---|---|
| 0.2 | 3 | 0.05 |
| 0.4 | 10 | 0.09 |
| 0.8 | 14 | 0.20 |
| 1.5 | 17 | 0.24 |
| 1.6 | 15 | 0.33 |

TABLE 3

| $Ga_2O_3$ T2 (nm) | MR change ratio (%) | RA ($\Omega \cdot \mu m^2$) |
|---|---|---|
| 0.2 | 5 | 0.05 |
| 0.4 | 13 | 0.07 |
| 0.8 | 19 | 0.20 |
| 1.1 | 17 | 0.30 |
| 1.5 | 15 | 0.40 |

As shown in Tables 2 and 3 and FIG. 8, the plurality of samples of the first and second comparative examples failed to provide an MR change ratio of 20% or higher with RA in the range of 0.1 to 0.3 $\Omega \cdot \mu m^2$. Then, for the spacer layer 54 of the MR element 5 according to the embodiment, a configuration that can provide an MR change ratio of 20% or higher with RA in the range of 0.1 to 0.3 $\Omega \cdot \mu m^2$ will be considered as preferable.

Figure 9:
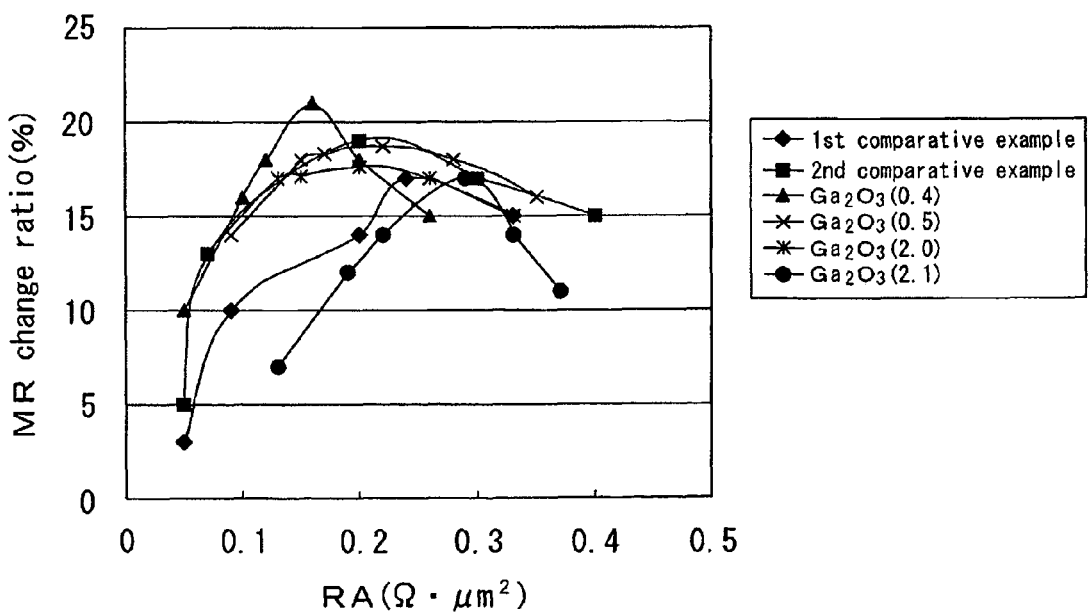
FIG. 9 is a characteristic chart showing the results of the experiment performed for determining a preferable configuration of the spacer layer.

Table 4 shows the MR change ratio and the RA of each of a plurality of samples that had T1 of 0.2 nm and T2 and T3 of various values. FIG. 9 shows the relationship between the MR change ratio and the RA for the samples shown in Table 4. FIG. 9 also shows the relationship between the MR change ratio and the RA for the samples of the first and second comparative examples. In the legends of FIG. 9, a plurality of samples with T2 of 0.4 nm are shown as "$Ga_2O_3$ (0.4)," ones with T2 of 0.5 nm as "$Ga_2O_3$ (0.5)," ones with T2 of 2.0 nm as "$Ga_2O_3$ (2.0)," and ones with T2 of 2.1 nm a "$Ga_2O_3$ (2.1)." The same holds for FIG. 10 to FIG. 13.

TABLE 4

| Cu T1 (nm) | $Ga_2O_3$ T2 (nm) | ZnO T3 (nm) | MR change ratio (%) | RA ($\Omega \cdot \mu m^2$) |
|---|---|---|---|---|
| 0.2 | 0.4 | 0.1 | 10 | 0.05 |
|  |  | 0.4 | 16 | 0.10 |
|  |  | 0.5 | 18 | 0.12 |
|  |  | 0.8 | 21 | 0.16 |
|  |  | 1.0 | 18 | 0.20 |
|  |  | 1.1 | 15 | 0.26 |
|  | 0.5 | 0.1 | 14 | 0.09 |
|  |  | 0.4 | 18 | 0.15 |
|  |  | 0.5 | 18.3 | 0.17 |
|  |  | 0.8 | 18.7 | 0.22 |
|  |  | 1.0 | 18 | 0.28 |
|  |  | 1.1 | 16 | 0.35 |
|  | 2.0 | 0.1 | 13 | 0.07 |
|  |  | 0.4 | 17 | 0.13 |

TABLE 4-continued

| Cu T1 (nm) | $Ga_2O_3$ T2 (nm) | ZnO T3 (nm) | MR change ratio (%) | RA ($\Omega \cdot \mu m^2$) |
|---|---|---|---|---|
|  |  | 0.5 | 17.1 | 0.15 |
|  |  | 0.8 | 17.6 | 0.20 |
|  |  | 1.0 | 17 | 0.26 |
|  |  | 1.1 | 15 | 0.33 |
|  | 2.1 | 0.1 | 7 | 0.13 |
|  |  | 0.4 | 12 | 0.19 |
|  |  | 0.5 | 14 | 0.22 |
|  |  | 0.8 | 17 | 0.29 |
|  |  | 1.0 | 14 | 0.33 |
|  |  | 1.1 | 11 | 0.37 |

Figure 10:
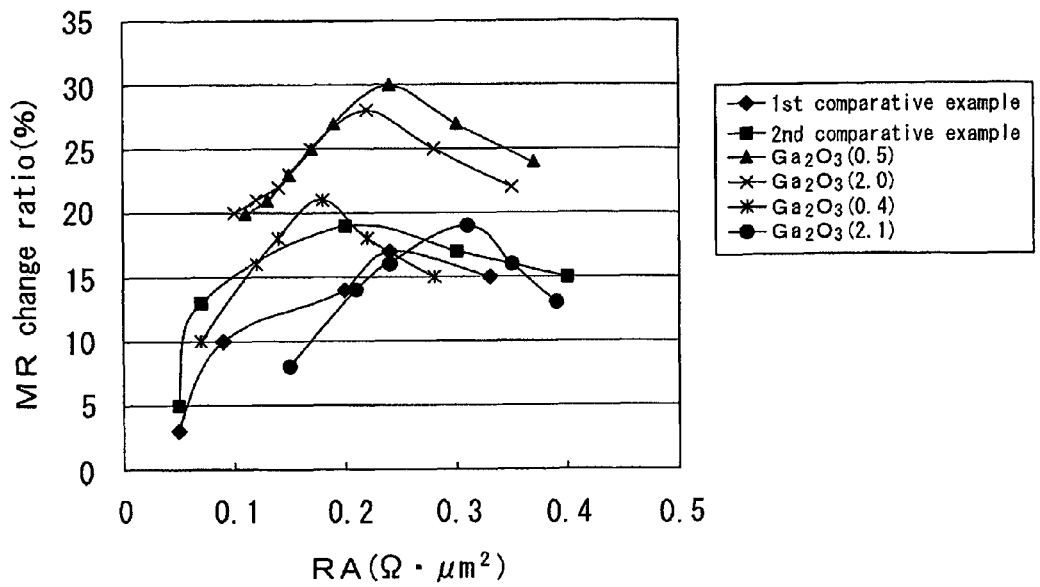
FIG. 10 is a characteristic chart showing the results of the experiment performed for determining a preferable configuration of the spacer layer.

Table 5 shows the MR change ratio and the RA of each of a plurality of samples that had T1 of 0.3 nm and T2 and T3 of various values. FIG. 10 shows the relationship between the MR change ratio and the RA for the samples shown in Table 5. FIG. 10 also shows the relationship between the MR change ratio and the RA for the samples of the first and second comparative examples.

TABLE 5

| Cu T1 (nm) | $Ga_2O_3$ T2 (nm) | ZnO T3 (nm) | MR change ratio (%) | RA ($\Omega \cdot \mu m^2$) |
|---|---|---|---|---|
| 0.3 | 0.4 | 0.1 | 10 | 0.07 |
|  |  | 0.4 | 16 | 0.12 |
|  |  | 0.5 | 18 | 0.14 |
|  |  | 0.8 | 21 | 0.18 |
|  |  | 1.0 | 18 | 0.22 |
|  |  | 1.1 | 15 | 0.28 |
|  | 0.5 | 0.1 | 20 | 0.11 |
|  |  | 0.2 | 21 | 0.13 |
|  |  | 0.3 | 23 | 0.15 |
|  |  | 0.4 | 25 | 0.17 |
|  |  | 0.5 | 27 | 0.19 |
|  |  | 0.8 | 30 | 0.24 |
|  |  | 1.0 | 27 | 0.30 |
|  |  | 1.1 | 24 | 0.37 |
|  | 2.0 | 0.1 | 20 | 0.10 |
|  |  | 0.2 | 21 | 0.12 |
|  |  | 0.3 | 22 | 0.14 |
|  |  | 0.4 | 23 | 0.15 |
|  |  | 0.5 | 25 | 0.17 |
|  |  | 0.8 | 28 | 0.22 |
|  |  | 1.0 | 25 | 0.28 |
|  |  | 1.1 | 22 | 0.35 |
|  | 2.1 | 0.1 | 8 | 0.15 |
|  |  | 0.4 | 14 | 0.21 |
|  |  | 0.5 | 16 | 0.24 |
|  |  | 0.8 | 19 | 0.31 |
|  |  | 1.0 | 16 | 0.35 |
|  |  | 1.1 | 13 | 0.39 |

Figure 11:
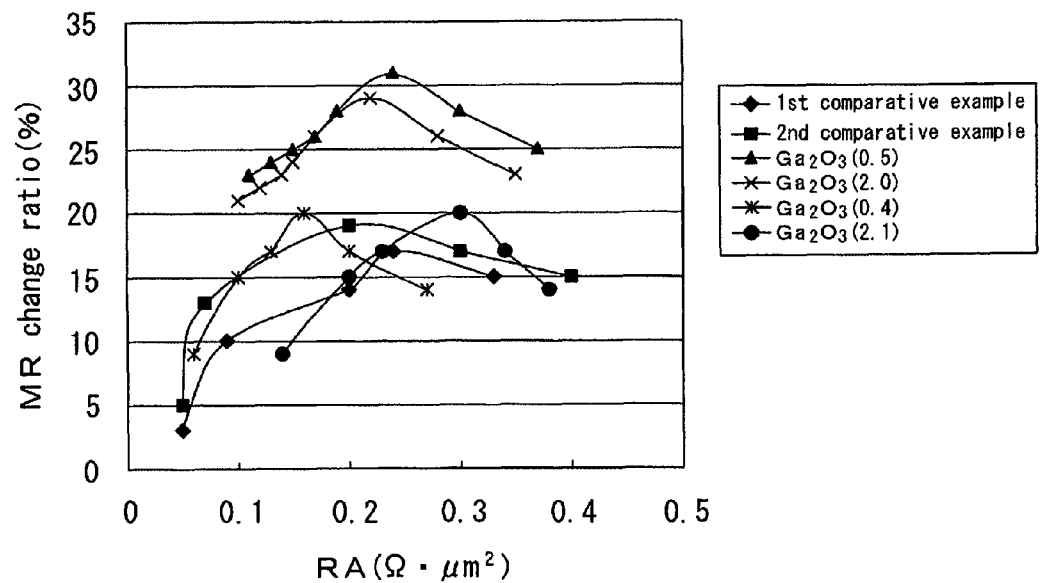
FIG. 11 is a characteristic chart showing the results of the experiment performed for determining a preferable configuration of the spacer layer.

Table 6 shows the MR change ratio and the RA of each of a plurality of samples that had T1 of 0.8 nm and T2 and T3 of various values. FIG. 11 shows the relationship between the MR change ratio and the RA for the samples shown in Table 6. FIG. 11 also shows the relationship between the MR change ratio and the RA for the samples of the first and second comparative examples.

TABLE 6

| Cu T1 (nm) | $Ga_2O_3$ T2 (nm) | ZnO T3 (nm) | MR change ratio (%) | RA ($\Omega \cdot \mu m^2$) |
|---|---|---|---|---|
| 0.8 | 0.4 | 0.1 | 9 | 0.06 |
|  |  | 0.4 | 15 | 0.10 |
|  |  | 0.5 | 17 | 0.13 |
|  |  | 0.8 | 20 | 0.16 |
|  |  | 1.0 | 17 | 0.20 |

TABLE 6-continued

| Cu T1 (nm) | Ga$_2$O$_3$ T2 (nm) | ZnO T3 (nm) | MR change ratio (%) | RA ($\Omega \cdot \mu m^2$) |
|---|---|---|---|---|
| | | 1.1 | 14 | 0.27 |
| | 0.5 | 0.1 | 23 | 0.11 |
| | | 0.2 | 24 | 0.13 |
| | | 0.3 | 25 | 0.15 |
| | | 0.4 | 26 | 0.17 |
| | | 0.5 | 28 | 0.19 |
| | | 0.8 | 31 | 0.24 |
| | | 1.0 | 28 | 0.30 |
| | | 1.1 | 25 | 0.37 |
| | 2.0 | 0.1 | 21 | 0.10 |
| | | 0.2 | 22 | 0.12 |
| | | 0.3 | 23 | 0.14 |
| | | 0.4 | 24 | 0.15 |
| | | 0.5 | 26 | 0.17 |
| | | 0.8 | 29 | 0.22 |
| | | 1.0 | 26 | 0.28 |
| | | 1.1 | 23 | 0.35 |
| | 2.1 | 0.1 | 9 | 0.14 |
| | | 0.4 | 15 | 0.20 |
| | | 0.5 | 17 | 0.23 |
| | | 0.8 | 20 | 0.30 |
| | | 1.0 | 17 | 0.34 |
| | | 1.1 | 14 | 0.38 |

Figure 12:
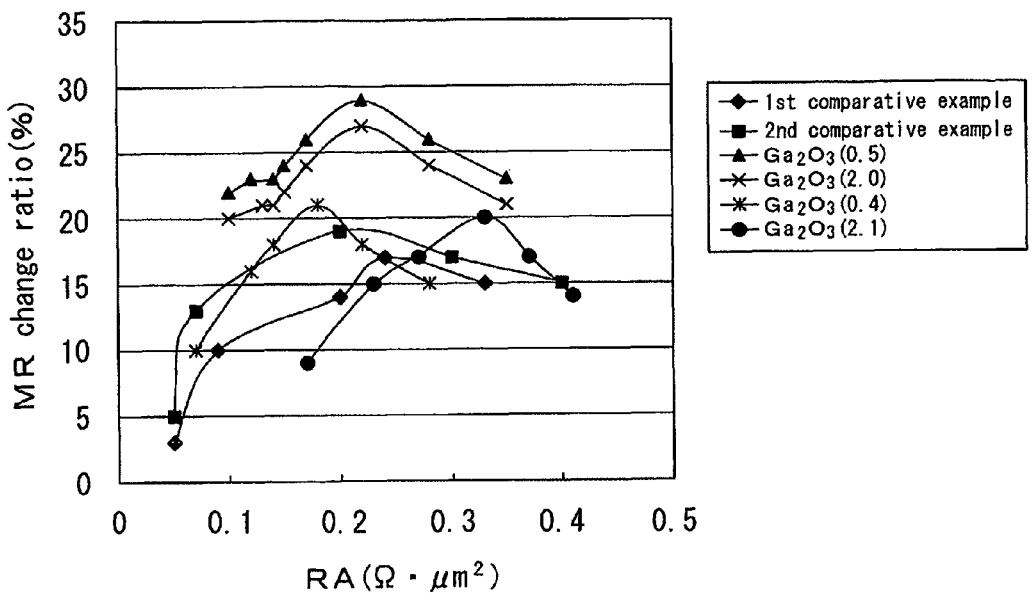
FIG. 12 is a characteristic chart showing the results of the experiment performed for determining a preferable configuration of the spacer layer.

Table 7 shows the MR change ratio and the RA of each of a plurality of samples that had T1 of 1.5 nm and T2 and T3 of various values. FIG. 12 shows the relationship between the MR change ratio and the RA for the samples shown in Table 7. FIG. 12 also shows the relationship between the MR change ratio and the RA for the samples of the first and second comparative examples.

TABLE 1

| Cu T1 (nm) | Ga$_2$O$_3$ T2 (nm) | ZnO T3 (nm) | MR change ratio (%) | RA ($\Omega \cdot \mu m^2$) |
|---|---|---|---|---|
| 1.5 | 0.4 | 0.1 | 10 | 0.07 |
| | | 0.4 | 16 | 0.12 |
| | | 0.5 | 18 | 0.14 |
| | | 0.8 | 21 | 0.18 |
| | | 1.0 | 18 | 0.22 |
| | | 1.1 | 15 | 0.28 |
| | 0.5 | 0.1 | 22 | 0.10 |
| | | 0.2 | 23 | 0.12 |
| | | 0.3 | 23 | 0.14 |
| | | 0.4 | 24 | 0.15 |
| | | 0.5 | 26 | 0.17 |
| | | 0.8 | 29 | 0.22 |
| | | 1.0 | 26 | 0.28 |
| | | 1.1 | 23 | 0.35 |
| | 2.0 | 0.1 | 20 | 0.10 |
| | | 0.2 | 21 | 0.13 |
| | | 0.3 | 21 | 0.14 |
| | | 0.4 | 22 | 0.15 |
| | | 0.5 | 24 | 0.17 |
| | | 0.8 | 27 | 0.22 |
| | | 1.0 | 24 | 0.28 |
| | | 1.1 | 21 | 0.35 |
| | 2.1 | 0.1 | 9 | 0.17 |
| | | 0.4 | 15 | 0.23 |
| | | 0.5 | 17 | 0.27 |
| | | 0.8 | 20 | 0.33 |
| | | 1.0 | 17 | 0.37 |
| | | 1.1 | 14 | 0.41 |

Figure 13:
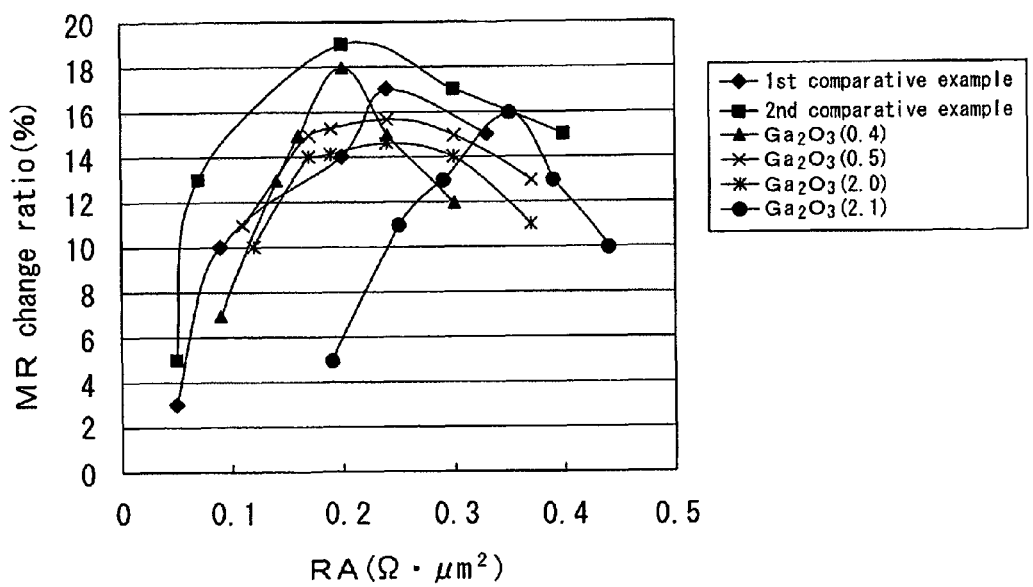
FIG. 13 is a characteristic chart showing the results of the experiment performed for determining a preferable configuration of the spacer layer.

Table 8 shows the MR change ratio and the RA of each of a plurality of samples that had T1 of 1.6 nm and T2 and T3 of various values. FIG. 13 shows the relationship between the MR change ratio and the RA for the samples shown in Table 8. FIG. 13 also shows the relationship between the MR change ratio and the RA for the samples of the first and second comparative examples.

TABLE 8

| Cu T1 (nm) | Ga$_2$O$_3$ T2 (nm) | ZnO T3 (nm) | MR change ratio (%) | RA ($\Omega \cdot \mu m^2$) |
|---|---|---|---|---|
| 1.6 | 0.4 | 0.1 | 7 | 0.09 |
| | | 0.4 | 13 | 0.14 |
| | | 0.5 | 15 | 0.16 |
| | | 0.8 | 18 | 0.20 |
| | | 1.0 | 15 | 0.24 |
| | | 1.1 | 12 | 0.30 |
| | 0.5 | 0.1 | 11 | 0.11 |
| | | 0.4 | 15 | 0.17 |
| | | 0.5 | 15.3 | 0.19 |
| | | 0.8 | 15.7 | 0.24 |
| | | 1.0 | 15 | 0.30 |
| | | 1.1 | 13 | 0.37 |
| | 2.0 | 0.1 | 10 | 0.12 |
| | | 0.4 | 14 | 0.17 |
| | | 0.5 | 14.1 | 0.19 |
| | | 0.8 | 14.6 | 0.24 |
| | | 1.0 | 14 | 0.30 |
| | | 1.1 | 11 | 0.37 |
| | 2.1 | 0.1 | 5 | 0.19 |
| | | 0.4 | 11 | 0.25 |
| | | 0.5 | 13 | 0.29 |
| | | 0.8 | 16 | 0.35 |
| | | 1.0 | 13 | 0.39 |
| | | 1.1 | 10 | 0.44 |

Hereinafter, a preferred configuration of the spacer layer 54 of the MR element 5 will be described with reference to the results of the experiment. For the cases where T1=0.2 nm (Table 4, FIG. 9) and T1=1.6 nm (Table 8, FIG. 13), most of the plurality of samples other than the samples of the first and second comparative examples failed to provide an MR change ratio of 20% or higher with RA in the range of 0.1 to 0.3 $\Omega \cdot \mu m^2$. For the cases where T1=0.3 nm (Table 5, FIG. 10), T1=0.8 nm (Table 6, FIG. 11), and T1=1.5 nm (Table 7, FIG. 12), an MR change ratio of 20% or higher was obtained with RA in the range of 0.1 to 0.3 $\Omega \cdot \mu m^2$ when T2 and T3 were in specific ranges. Consequently, it is preferred that T1 fall within the range of 0.3 to 1.5 nm.

For the cases where T1=0.3 nm (Table 5, FIG. 10), T1=0.8 nm (Table 6, FIG. 11), and T1=1.5 nm (Table 7, FIG. 12), an MR change ratio of 20% or higher was obtained with RA in the range of 0.1 to 0.3 $\Omega \cdot \mu m^2$ when T2 was in the range of 0.5 to 2.0 nm and T3 was in the range of 0.1 to 1.0 nm. Note that Table 5 to Table 7 and FIG. 10 to FIG. 12 show no experimental results for cases where T2 is greater than 0.5 and smaller than 2.0 nm. For the cases where T2 is greater than 0.5 nm and smaller than 2.0 nm, however, it has also been experimentally verified that an MR change ratio of 20% or higher is obtained with RA in the range of 0.1 to 0.3 $\Omega \cdot \mu^2$ when T1 is in the range of 0.3 to 1.5 nm and T3 is in the range of 0.1 to 1.0 nm.

Consequently, it is preferred that the spacer layer 54 of the MR element 5 be configured to have the nonmagnetic metal layer 541, the first oxide semiconductor layer 542, and the second oxide semiconductor layer 543 stacked in this order, with T1 in the range of 0.3 to 1.5 nm, T2 in the range of 0.5 to 2.0 nm, and T3 in the range of 0.1 to 1.0 nm. With such a configuration, the spacer layer 54 can provide a higher MR change ratio with RA in the range of 0.1 to 0.3 $\Omega \cdot \mu m^2$ as compared with the case where the spacer layer 54 includes only either one of the first oxide semiconductor layer 542 and the second oxide semiconductor layer 543 (first and second comparative examples). As can be seen from the foregoing experimental results and discussions, it is possible according to the present embodiment to make the resistance (resistance-area product) of the MR element 5 appropriate in value and make the MR change ratio sufficiently high.

It should be noted that one atomic layer of ZnO, the material of the second oxide semiconductor layer 543, has a thickness of approximately 0.5 nm. The T3 values smaller than 0.5 nm are therefore averages across the entire area of the second oxide semiconductor layer 543. When T3 is smaller than 0.5 nm, ZnO is patchily distributed in the second oxide semiconductor layer 543. To stabilize the characteristic of the MR element 5, it is preferred that the second oxide semiconductor layer 543 be a layer in which ZnO is uniformly distributed, i.e., a layer having T3 of 0.5 nm. From this point of view, it is more preferred that T3 fall within the range of 0.5 to 1.0 nm.

As shown in Table 5 to Table 7, if T1 is in the range of 0.3 to 1.5 nm and T2 is in the range of 0.5 to 2.0 nm, the MR change ratio is higher when T3 is in the range of 0.5 to 1.0 nm than when T3 is smaller than 0.5 nm. From this point of view also, it is more preferred that T3 fall within the range of 0.5 to 1.0 nm.

The second oxide semiconductor layer 543 may be formed by depositing ZnO itself by sputtering, for example. Alternatively, the second oxide semiconductor layer 543 may be formed by initially forming a Zn layer by, for example, sputtering, and then applying an oxidation treatment to the Zn layer.

Second Embodiment

Figure 14:
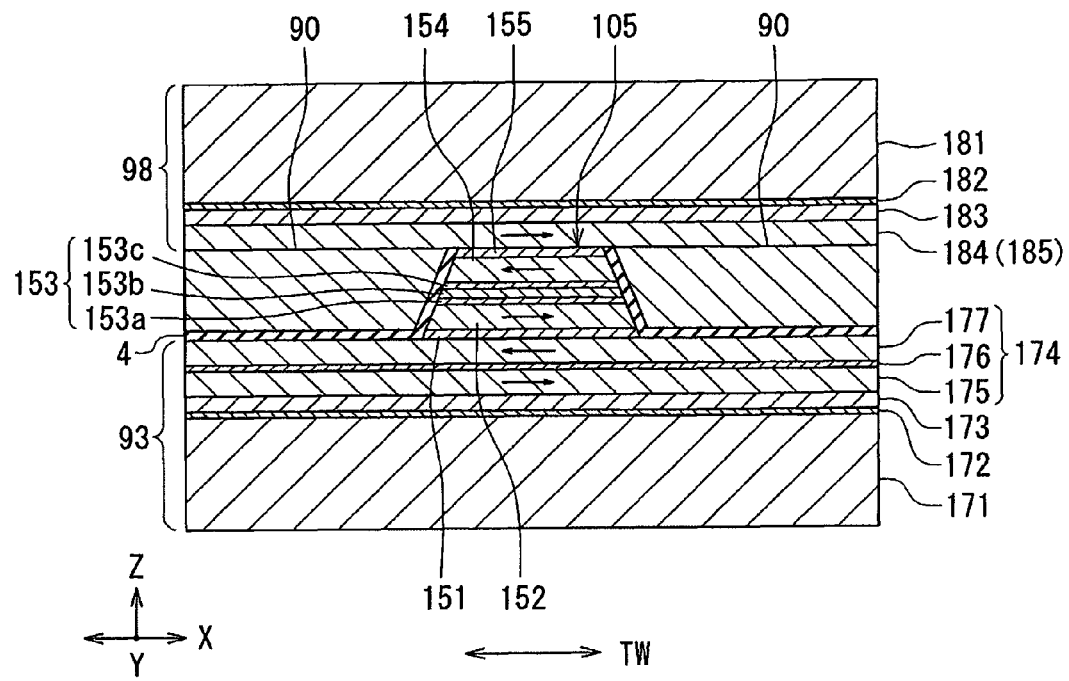
FIG. 14 is a cross-sectional view showing a cross section of a read head including a magnetoresistive element according to a second embodiment of the invention, the cross section being parallel to the medium facing surface.

A second embodiment of the invention will now be described with reference to FIG. 14 to FIG. 17. FIG. 14 is a cross-sectional view showing a cross section of a read head including an MR element according to the present embodiment, the cross section being parallel to the medium facing surface. The read head in the present embodiment has a first read shield portion 93 and a second read shield portion 98 instead of the first read shield 3 and the second read shield 8 of the first embodiment, and has an MR element 105 according to the present embodiment instead of the MR element 5 of the first embodiment. The MR element 105 and the second read shield portion 98 are stacked in this order on the first read shield portion 93. The planar shape (the shape viewed from above) of the MR element 105 is smaller than that of each of the read shield portions 93 and 98. The insulating layer 4 of the present embodiment covers the two sides of the MR element 105 and a rear end of the MR element 105, which is the end farther from the medium facing surface 40, and also covers the top surface of the first read shield portion 93 except the area on which the MR element 105 is disposed.

In the present embodiment, the read head has a bias magnetic field applying layer 106 (see FIG. 15 to FIG. 17) instead of the two bias magnetic field applying layers 6 of the first embodiment. The bias magnetic field applying layer 106 is disposed between the first read shield portion 93 and the second read shield portion 98, and adjoins the rear end of the MR element 105 via the insulating layer 4. Although not shown, the read head further includes a protection layer disposed between the bias magnetic field applying layer 106 and the second read shield portion 98. The protection layer is made of a nonmagnetic conductive material such as Cr.

The read head further includes two nonmagnetic layers 90 that are disposed between the first read shield portion 93 and the second read shield portion 98 and adjoins the two sides of the MR element 105 via the insulating layer 4. In the present embodiment, the insulating refill layer 7 is disposed around the nonmagnetic layers 90 and the bias magnetic field applying layer 106. The nonmagnetic layers 90 are made of a nonmagnetic metal material. The material of the nonmagnetic layers 90 may be Cr, Ti, CrTi, Ta, or Ru, for example.

The first read shield portion 93 includes a first main shield layer 171, and also includes an underlayer 172, a first antiferromagnetic layer 173, and a first exchange coupling shield layer 174 that are stacked in this order on the first main shield layer 171.

The second read shield portion 98 includes a second exchange coupling shield layer 184, a second antiferromagnetic layer 183, a nonmagnetic cap layer 182, and a second main shield layer 181 that are stacked in this order on the MR element 105.

The first exchange coupling shield layer 174 is exchange-coupled to the first antiferromagnetic layer 173. The second exchange coupling shield layer 184 is exchange-coupled to the second antiferromagnetic layer 183. In the present embodiment, either one of the first exchange coupling shield layer 174 and the second exchange coupling shield layer 184 includes a nonmagnetic middle layer that is made of a nonmagnetic conductive material, and two ferromagnetic layers that are antiferromagnetically exchange-coupled to each other via the nonmagnetic middle layer. The other of the first exchange coupling shield layer 174 and the second exchange coupling shield layer 184 includes one or more ferromagnetic layers, but does not include any nonmagnetic middle layer. FIG. 14 shows an example where the first exchange coupling shield layer 174 includes the nonmagnetic middle layer and two ferromagnetic layers, the two ferromagnetic layers being antiferromagnetically exchange-coupled to each other via the nonmagnetic middle layer, while the second exchange coupling shield layer 184 includes one or more ferromagnetic layers and no nonmagnetic middle layer.

In the example, the first exchange coupling shield layer 174 includes the nonmagnetic middle layer 176 made of a nonmagnetic conductive material, and the two ferromagnetic layers 175 and 177 which are antiferromagnetically exchange-coupled to each other via the nonmagnetic middle layer 176. The ferromagnetic layer 175 is disposed between the first antiferromagnetic layer 173 and the nonmagnetic middle layer 176, and is exchange-coupled to the first antiferromagnetic layer 173. The ferromagnetic layer 177 is disposed between the nonmagnetic middle layer 176 and the MR element 105, and is antiferromagnetically exchange-coupled to the ferromagnetic layer 175 via the nonmagnetic middle layer 176 by the RKKY interaction. The nonmagnetic middle layer 176 contains at least one element selected from the group consisting of Ru, Rh, Ir, Cr, Cu, Ag, Au, Pt, and Pd, for example. In the example, the second exchange coupling shield layer 184 includes only a ferromagnetic layer 185 and no nonmagnetic middle layer. The ferromagnetic layer 185 is exchange-coupled to the second antiferromagnetic layer 183. Alternatively, contrary to this example, the second exchange coupling shield layer 184 may include a nonmagnetic middle layer, and two ferromagnetic layers that are antiferromagnetically exchanged-coupled to each other via the nonmagnetic middle layer. In such a configuration, the first exchange coupling shield layer 174 includes one or more ferromagnetic layers and no nonmagnetic middle layer.

The main shield layers 171 and 181 and the ferromagnetic layers 175, 177, and 185 are each made of a soft magnetic material such as NiFe, CoFe, CoFeB, CoFeNi, or FeN. The main shield layers 171 and 181 and the ferromagnetic layers 175, 177, and 185 each have the shield function of absorbing an excessive magnetic flux.

The underlayer 172 and the nonmagnetic cap layer 182 are each made of a nonmagnetic conductive material. The underlayer 172 contains at least one of Ta and Ru, for example. The nonmagnetic cap layer 182 is made of NiCr, for example.

The antiferromagnetic layers 173 and 183 are each made of an antiferromagnetic material. The antiferromagnetic material to be used for the antiferromagnetic layers 173 and 183 may be a non-heat-induced antiferromagnetic material or a heat-induced antiferromagnetic material.

The ferromagnetic layer 175 of the first exchange coupling shield layer 174 is exchange-coupled to the first antiferromagnetic layer 173, whereby the ferromagnetic layer 175 is made into a single magnetic domain such that the ferromagnetic layer 175 is magnetized in a certain direction. Similarly, the ferromagnetic layer 185 of the second exchange coupling shield layer 184 is exchange-coupled to the second antiferromagnetic layer 183, whereby the ferromagnetic layer 185 is made into a single magnetic domain such that the ferromagnetic layer 185 is magnetized in a certain direction. The directions of magnetization of the ferromagnetic layers 175 and 185 are set by annealing in a magnetic field, and are determined by the direction of the magnetic field at that time. The ferromagnetic layers 175 and 185 thus have the same direction of magnetization. Specifically, the ferromagnetic layers 175 and 185 have the same direction of magnetization parallel to the track width direction TW.

In the first exchange coupling shield layer 174, the ferromagnetic layer 177 is antiferromagnetically exchange-coupled to the ferromagnetic layer 175 via the nonmagnetic middle layer 176. This makes the directions of magnetization of the ferromagnetic layers 175 and 177 antiparallel to each other, whereby the ferromagnetic layer 177 is made into a single magnetic domain such that the ferromagnetic layer 177 is magnetized in a certain direction. Consequently, the directions of magnetization of the ferromagnetic layers 185 and 177 are antiparallel to each other.

The MR element 105 according to the present embodiment is a CPP-GMR element, as in the first embodiment. The first read shield portion 93 and the second read shield portion 98 also function as a pair of electrodes for feeding a sense current to the MR element 105 in a direction intersecting the planes of the layers constituting the MR element 105, such as the direction perpendicular to the planes of the layers constituting the MR element 105.

As shown in FIG. 14, the MR element 105 includes a spacer layer 153, a first free layer 152 disposed between the first exchange coupling shield layer 174 (ferromagnetic layer 177) and the spacer layer 153, and a second free layer 154 disposed between the second exchange coupling shield layer 184 (ferromagnetic layer 185) and the spacer layer 153. Each of the free layers 152 and 154 is a ferromagnetic layer whose direction of magnetization changes in response to a signal magnetic field, which is an external magnetic field. The first free layer 152 corresponds to the first ferromagnetic layer according to the present invention. The second free layer 154 corresponds to the second ferromagnetic layer according to the present invention. The MR element 105 further includes a nonmagnetic conductive layer 151 disposed between the first exchange coupling shield layer 174 (ferromagnetic layer 177) and the first free layer 152, and a nonmagnetic conductive layer 155 disposed between the second free layer 154 and the second exchange coupling shield layer 184 (ferromagnetic layer 185). The MR element 105 is a shield-coupling MR element in which the directions of magnetization of the two free layers 152 and 154 are controlled by the first exchange coupling shield layer 174 and the second exchange coupling shield layer 184.

The free layers 152 and 154 are each made of a ferromagnetic material having a low coercivity, such as NiFe, CoFe, CoFeB, CoFeNi, or FeN.

The spacer layer 153 has the same configuration as that of the spacer layer 54 of the first embodiment. That is, the spacer layer 153 includes a nonmagnetic metal layer 153a, a first oxide semiconductor layer 153b, and a second oxide semiconductor layer 153c that are stacked in this order on the first free layer 152. The nonmagnetic metal layer 153a, the first oxide semiconductor layer 153b, and the second oxide semiconductor layer 153c have the same configurations as those of the nonmagnetic metal layer 541, the first oxide semiconductor layer 542, and the second oxide semiconductor layer 543 of the first embodiment. The top surface of the second oxide semiconductor layer 153c is in contact with the bottom surface of the second free layer 154.

The nonmagnetic conductive layer 151 is in contact with the bottom surface of the first free layer 152 and the top surface of the ferromagnetic layer 177. The nonmagnetic conductive layer 155 is in contact with the top surface of the second free layer 154 and the bottom surface of the ferromagnetic layer 185. The nonmagnetic conductive layers 151 and 155 are each made of a nonmagnetic conductive material containing at least one of Ru, Rh, Ir, Cr, Cu, Ag, Au, Pt, and Pd, for example.

The ferromagnetic layer 177 of the first exchange coupling shield layer 174 and the first free layer 152 are antiferromagnetically exchange-coupled to each other via the nonmagnetic conductive layer 151 by the RKKY interaction. The directions of magnetization of the first free layer 152 and the ferromagnetic layer 177 are therefore antiparallel to each other. In this way, the first free layer 152 is magnetically coupled to the first exchange coupling shield layer 174, whereby the direction of magnetization of the first free layer 152 is controlled.

The ferromagnetic layer 185 of the second exchange coupling shield layer 184 and the second free layer 154 are antiferromagnetically exchange-coupled to each other via the nonmagnetic conductive layer 155 by the RKKY interaction. The directions of magnetization of the second free layer 154 and the ferromagnetic layer 185 are therefore antiparallel to each other. In this way, the second free layer 154 is magnetically coupled to the second exchange coupling shield layer 184, whereby the direction of magnetization of the second free layer 154 is controlled.

In the present embodiment, the directions of magnetization of the ferromagnetic layers 177 and 185 are antiparallel to each other. Suppose a state where the first and second free layers 152 and 154 are subjected to no external magnetic field other than the magnetic fields that result from the first and second exchange coupling shield layers 174 and 184. When in such a state, the directions of magnetization of the first free layer 152 and the ferromagnetic layer 177 are antiparallel to each other, and the directions of magnetization of the second free layer 154 and the ferromagnetic layer 185 are also antiparallel to each other. Consequently, when in such a state, the directions of magnetization of the first free layer 152 and the second free layer 154 are antiparallel to each other.

When no magnetic field is applied to the MR element 105 from the outside of the MR element 105, all of magnetic fields to be applied to the free layers 152 and 154, except the bias magnetic field produced by the bias magnetic field applying layer 106, result from the first and second exchange coupling shield layers 174 and 184. Therefore, the state where the free layers 152 and 154 are subjected to no external magnetic field other than the magnetic fields that result from the first and second exchange coupling shield layers 174 and 184 refers to the state where the free layers 152 and 154 are not subjected to the bias magnetic field produced by the bias magnetic field applying layer 106 when no magnetic field is applied to the MR element 105 from the outside of the MR element 105.

Possible configurations of the MR element 105 of the present embodiment are not limited to the configuration shown in FIG. 14. For example, the nonmagnetic conductive layers 151 and 155 in the MR element 105 may be replaced with first and second coupling layers each of which includes a plurality of nonmagnetic conductive layers and magnetic layers interposed between adjacent ones of the nonmagnetic conductive layers. Here, the first coupling layer and the second coupling layer shall include the same number of layers. This makes it possible to make the directions of magnetization of the first free layer 152 and the second free layer 154 antiparallel to each other.

The bias magnetic field applying layer 106 applies a bias magnetic field to the free layers 152 and 154 so that the directions of magnetization of the free layers 152 and 154 are changed from those in the state where no bias magnetic field is applied to the free layers 152 and 154. The bias magnetic field applying layer 106 preferably applies a bias magnetic field to the free layers 152 and 154 so that the directions of magnetization of the free layers 152 and 154 become orthogonal to each other.

Figure 15:
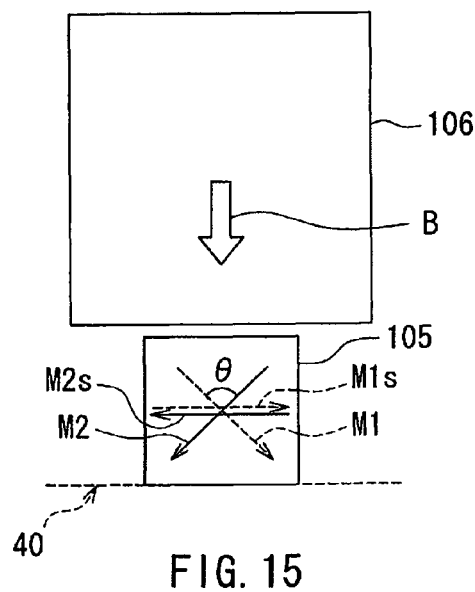
FIG. 15 is an explanatory diagram for explaining the operation of the magnetoresistive element according to the second embodiment of the invention.
Figure 16:
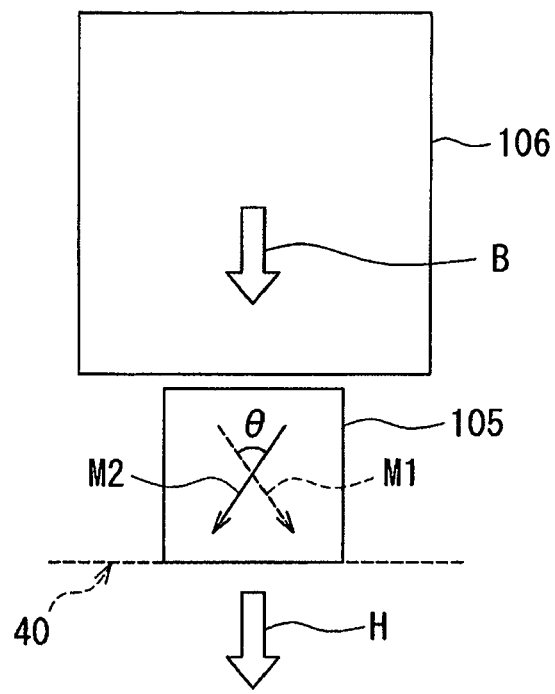
FIG. 16 is an explanatory diagram for explaining the operation of the magnetoresistive element according to the second embodiment of the invention.
Figure 17:
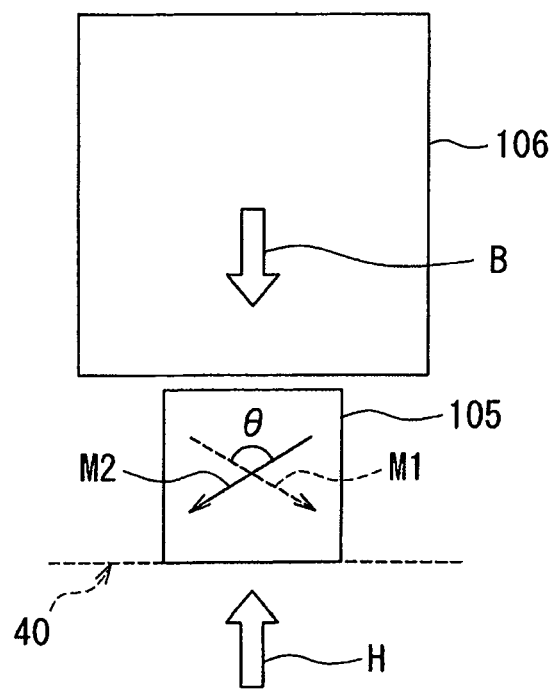
FIG. 17 is an explanatory diagram for explaining the operation of the magnetoresistive element according to the second embodiment of the invention.

The operation of the MR element 105 according to the present embodiment will now be described with reference to FIG. 15 to FIG. 17. FIG. 15 to FIG. 17 each show the MR element 105 and the bias magnetic field applying layer 106. In FIG. 15 to FIG. 17, the arrow with the symbol "B" indicates the bias magnetic field produced by the bias magnetic field applying layer 106. The arrow with the symbol "M1s" indicates the direction of magnetization of the first free layer 152 when the first free layer 152 is not subjected to any external magnetic field (including bias magnetic field) other than the magnetic fields that result from the first and second exchange coupling shield layers 174 and 184. The arrow with the symbol "M2s" indicates the direction of magnetization of the second free layer 154 when the second free layer 154 is not subjected to any external magnetic field described above. The arrow with the symbol "M1" indicates the direction of magnetization of the first free layer 152 when the first free layer 152 is subjected to the bias magnetic field B. The arrow with the symbol "M2" indicates the direction of magnetization of the second free layer 154 when the second free layer 154 is subjected to the bias magnetic field B.

As shown in FIG. 15, the directions of magnetization of the free layers 152 and 154 are antiparallel to each other when the free layers 152 and 154 are not subjected to any external magnetic field. When the free layers 152 and 154 are subjected to the bias magnetic field B and no signal magnetic field, the directions of magnetization of the free layers 152 and 154 become non-antiparallel to each other. When in such a state, the directions of magnetization of the first free layer 152 and the second free layer 154 each preferably form an angle of 45 degrees with respect to the medium facing surface 40 so that the relative angle θ between the directions of magnetization of the free layers 152 and 154 is 90 degrees.

FIG. 16 shows a state where the free layers 152 and 154 are subjected to the bias magnetic field B and also a signal magnetic field H in the same direction as the bias magnetic field B. When in such a state, the angle that the direction of magnetization of the first free layer 152 forms with respect to the medium facing surface 40 and the angle that the direction of magnetization of the second free layer 154 forms with respect to the medium facing surface 40 are both greater as compared with the state shown in FIG. 15. Consequently, the relative angle θ between the directions of magnetization of the free layers 152 and 154 is smaller as compared with the state shown in FIG. 15.

FIG. 17 shows a state where the free layers 152 and 154 are subjected to the bias magnetic field B and also a signal magnetic field H in the direction opposite to the direction of the bias magnetic field B. When in such a state, the angle that the direction of magnetization of the first free layer 152 forms with respect to the medium facing surface 40 and the angle that the direction of magnetization of the second free layer 154 forms with respect to the medium facing surface 40 are both smaller as compared with the state shown in FIG. 15. Consequently, the relative angle θ between the directions of magnetization of the free layers 152 and 154 is greater as compared with the state shown in FIG. 15.

As seen above, the relative angle between the directions of magnetization of the free layers 152 and 154 changes in response to the signal magnetic field, and the change causes a change in resistance of the MR element 105. The signal magnetic field can therefore be detected by detecting the resistance of the MR element 105. The resistance of the MR element 105 can be determined from the potential difference produced in the MR element 105 when a sense current is fed to the MR element 105. With the MR element 105, it is thus possible to read data stored on the recording medium.

The effects of the MR element 105 according to the present embodiment will now be described. In the present embodiment, the ferromagnetic layer 175 of the first exchange coupling shield layer 174 is exchange-coupled to the first antiferromagnetic layer 173. The ferromagnetic layer 177 is antiferromagnetically exchange-coupled to the ferromagnetic layer 175 via the nonmagnetic middle layer 176. The direction of magnetization of the ferromagnetic layer 177 is thereby determined. Meanwhile, the ferromagnetic layer 185 of the second exchange coupling shield layer 184 is exchange-coupled to the second antiferromagnetic layer 183, whereby the direction of magnetization of the ferromagnetic layer 185 is determined. Consequently, the directions of magnetization of the ferromagnetic layers 185 and 177 are antiparallel to each other. The first free layer 152 is magnetically coupled to the ferromagnetic layer 177, and the second free layer 154 is magnetically coupled to the ferromagnetic layer 185. Specifically, the first free layer 152 is antiferromagnetically exchange-coupled to the ferromagnetic layer 177 via the nonmagnetic conductive layer 151. The second free layer 154 is antiferromagnetically exchange-coupled to the ferromagnetic layer 185 via the nonmagnetic conductive layer 155. As a result, the directions of magnetization of the two free layers 152 and 154 are antiparallel to each other when the two free layers 152 and 154 are subjected to no external magnetic field other than the magnetic fields that result from the first and second exchange coupling shield layers 174 and 184. According to the present embodiment, it is thus possible to maintain the directions of magnetization of the two free layers 152 and 154 antiparallel to each other when in the state where no external magnetic field is applied, without making use of antiferromagnetic coupling between the two free layers via the spacer layer 153. Consequently, according to the present embodiment, no limitation is imposed on the material and thickness of the spacer layer 153, in contrast to the case of making use of antiferromagnetic coupling between the two free layers.

The remainder of configuration, function and effects of the present embodiment are similar to those of the first embodiment.

The present invention is not limited to the foregoing embodiments, and various modifications may be made thereto. For example, given an MR element having two free layers as in the second embodiment, a possible method for making the directions of magnetization of the two free layers antiparallel to each other when no external magnetic field is applied is not limited to the method described in the second embodiment. For example, a hard magnetic layer may be used or shape magnetic anisotropy may be utilized to make the directions of magnetization of the first ferromagnetic layer in the first read shield portion and the second ferromagnetic layer in the second read shield portion antiparallel to each other, so that one of the free layers is magnetically coupled to the first ferromagnetic layer and the other free layer is magnetically coupled to the second ferromagnetic layer.

While the foregoing embodiments have been described with reference to a magnetic head having a structure in which the read head is formed on the base body and the write head is stacked on the read head, the read head and the write head may be stacked in the reverse order. If the magnetic head is to be used only for read operations, the magnetic head may be configured to include the read head only.

The present invention is applicable not only to the MR element that is intended for use as the read head of a magnetic head in a magnetic recording device, but also to all MR elements intended for various applications such as oscillators, MRAMs, and magnetic sensors.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A magnetoresistive element comprising:
a first ferromagnetic layer;
a second ferromagnetic layer; and
a spacer layer that is disposed between the first and second ferromagnetic layers,
the magnetoresistive element being fed a current for magnetic signal detection in a direction intersecting a plane of each of the layers, wherein:
the spacer layer includes a nonmagnetic metal layer, a first oxide semiconductor layer, and a second oxide semiconductor layer that are stacked in this order;
the nonmagnetic metal layer is made of Cu, and has a thickness in the range of 0.3 to 1.5 nm;
the first oxide semiconductor layer is made of a Ga oxide semiconductor, and has a thickness in the range of 0.5 to 2.0 nm; and
the second oxide semiconductor layer is made of a Zn oxide semiconductor, and has a thickness in the range of 0.1 to 1.0 nm.

2. The magnetoresistive element according to claim 1, wherein the Ga oxide semiconductor is $Ga_2O_3$, and the Zn oxide semiconductor is ZnO.

3. The magnetoresistive element according to claim 1, wherein the second oxide semiconductor layer has a thickness in the range of 0.5 to 1.0 nm.

4. The magnetoresistive element according to claim 1, wherein the first ferromagnetic layer is a free layer whose direction of magnetization changes in response to an external magnetic field, and the second ferromagnetic layer is a pinned layer whose direction of magnetization is pinned.

5. The magnetoresistive element according to claim 1, wherein each of the first and second ferromagnetic layers is a free layer whose direction of magnetization changes in response to an external magnetic field, and a relative angle between the direction of magnetization of the first ferromagnetic layer and the direction of magnetization of the second ferromagnetic layer changes in response to the external magnetic field.

6. A thin-film magnetic head comprising:
a medium facing surface that faces a recording medium; and
the magnetoresistive element according to claim 1 disposed near the medium facing surface.

7. A head assembly comprising a slider, and a supporter that flexibly supports the slider, wherein the slider includes the thin-film magnetic head according to claim 6 and is disposed to face the recording medium.

8. A magnetic recording device comprising the thin-film magnetic head according to claim 6, a recording medium, and a positioning device that supports the thin-film magnetic head and positions the thin-film magnetic head with respect to the recording medium.

* * * * *